(12) United States Patent
Shakeri et al.

(10) Patent No.: US 7,509,244 B1
(45) Date of Patent: Mar. 24, 2009

(54) DISTRIBUTED MODEL COMPILATION

(75) Inventors: Mojdeh Shakeri, Southborough, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 377 days.

(21) Appl. No.: 11/021,907

(22) Filed: Dec. 22, 2004

(51) Int. Cl.
*G06F 9/455* (2006.01)
(52) U.S. Cl. ............... 703/7; 703/2; 703/13; 717/109; 717/140; 717/149; 717/120; 717/105; 709/201; 715/763
(58) Field of Classification Search ............... 703/2, 703/1, 21, 13, 7; 345/810, 771, 762; 714/38; 717/109, 124, 126, 131, 140, 149, 120; 702/108; 709/201, 328; 705/4; 711/100; 718/104, 718/100; 715/763; 716/7
See application file for complete search history.

(56) References Cited

U.S. PATENT DOCUMENTS

| | | | | |
|---|---|---|---|---|
| 6,080,204 | A * | 6/2000 | Mendel | 716/7 |
| 6,106,571 | A * | 8/2000 | Maxwell | 717/131 |
| 6,253,372 | B1 | 6/2001 | Komatsu et al. | 717/149 |
| 6,345,240 | B1 * | 2/2002 | Havens | 703/21 |
| 7,275,026 | B2 * | 9/2007 | Mani et al. | 703/13 |
| 2002/0147855 | A1 * | 10/2002 | Lu | 709/310 |
| 2002/0196285 | A1 * | 12/2002 | Sojoodi et al. | 345/771 |
| 2003/0005180 | A1 * | 1/2003 | Schmit et al. | 709/328 |
| 2003/0107595 | A1 * | 6/2003 | Ciolfi | 345/762 |
| 2003/0184596 | A1 * | 10/2003 | Kodosky et al. | 345/810 |
| 2003/0200536 | A1 * | 10/2003 | Stuefe | 717/140 |
| 2003/0237026 | A1 * | 12/2003 | Petersen et al. | 714/38 |
| 2004/0128120 | A1 * | 7/2004 | Coburn et al. | 703/26 |
| 2004/0194060 | A1 * | 9/2004 | Ousterhout et al. | 717/120 |
| 2005/0066285 | A1 * | 3/2005 | Santori et al. | 715/763 |
| 2005/0090997 | A1 * | 4/2005 | Bostanci et al. | 702/108 |
| 2005/0114841 | A1 * | 5/2005 | Moskowitz et al. | 717/126 |
| 2005/0132378 | A1 * | 6/2005 | Horvitz et al. | 718/104 |
| 2005/0198634 | A1 * | 9/2005 | Nielsen et al. | 718/100 |
| 2005/0203718 | A1 * | 9/2005 | Carek et al. | 703/1 |
| 2005/0257194 | A1 * | 11/2005 | Morrow et al. | 717/109 |
| 2005/0257195 | A1 * | 11/2005 | Morrow et al. | 717/109 |
| 2006/0020657 | A1 * | 1/2006 | Liu et al. | 709/201 |
| 2006/0036799 | A1 * | 2/2006 | Shah et al. | 711/100 |
| 2006/0047540 | A1 * | 3/2006 | Hutten et al. | 705/4 |
| 2006/0101402 | A1 * | 5/2006 | Miller et al. | 717/124 |

* cited by examiner

*Primary Examiner*—Paul L Rodriguez
*Assistant Examiner*—Kandasamy Thangavelu
(74) *Attorney, Agent, or Firm*—Lahive & Cockfield, LLP; Kevin J. Canning

(57) ABSTRACT

Methods and systems are provided for partitioning and distributing the model processing of a graphical model to provide an executable form of the graphical model. The methods and systems determine tasks of the model processing that can be processed separately and concurrently from other tasks. A distribution scheme for distributing the model processing tasks is determined that considers the characteristics of the model processing tasks in view of the characteristics of available computing resources. Variations of partitioning and distributing the model processing tasks can be determined to provide for distributed processing in an optimized or desired manner. The results of the distributed processing of the model processing tasks are obtained and combined to provide an executable form for the graphical model.

89 Claims, 10 Drawing Sheets

DISTRIBUTED MODEL COMPILATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention generally relates to technical computing, and, more particularly, to distributed model compilation of a graphical model.

BACKGROUND INFORMATION

Various types of graphical models and methods are used extensively in the modeling of computations, algorithms and operations that can be performed on computational hardware devices, such as a computer, microcontroller, FPGA, and custom hardware. Graphical modeling can be used for the design, analysis, code generation, and synthesis and testing of many systems, including dynamic and engineered systems. Types of such graphical models include time-based block diagrams such as those found within Simulink® from The MathWorks, Inc. of Natick, Mass., state-based and flow diagrams, such as those found within Stateflow® from The MathWorks, Inc. of Natick, Mass., data-flow diagrams, circuit diagrams, and software diagrams, such as those found in the Unified Modeling Language. A common characteristic among these various forms of graphical models is that they define semantics on how to execute the graphical model. For example, a block diagram model provided by Simulink® can be processed via a model compilation process to convert the model into an executable form. The executable form of the block diagram model can then be executed to simulate the model over a span of time. The simulation uses information provided by the system's representation in the block diagram model to simulate the system behavior of the model.

Graphical models can be used to solve complex engineering and scientific problems by developing mathematical models that simulate the problem. Graphical modeling environments can provide an extensive set of building blocks that represent mathematical operations, logic constructs, and other specific modeling and design tasks for modeling, simulating, and testing a wide range of dynamic systems. A model is prototyped, tested and analyzed by running the model under multiple boundary conditions, data parameters, or just a number of initial guesses. Many engineering and scientific problems require larger and more complex modeling. For example, graphical modeling may be used to model, design and simulate the many systems integrated into an aircraft or automobile. With the types of problems that can be modeled and simulated in a graphical modeling environment, graphical models have reached a remarkable level of complexity, and so has the simulation of such models.

Graphical models, such as a block diagram model, can be hierarchical and reference and organize a multitude of graphical models each representing an additional system. In turn, these referenced graphical models may also be large or complex, and also may reference additional graphical models. In this manner, a top view of a hierarchical block diagram model can provide a high-level view of the system with one or more blocks of this top view each representing a sub-system block diagram model. One can drill down into the subsystem view from the top level to view the details of this sub-system model. The block diagram model of the sub-system can also include a multitude of blocks, and in turn, some of these blocks may represent additional block diagram models and details of further sub-systems. As such, a hierarchical model may be constructed with hundreds or more block diagram models in a multitude of levels with hundreds of thousands of blocks representing primitive and aggregate computations, algorithms, and operations.

In the design of graphical models, partitioning of the model and design tasks may be necessary considering the design and development of the overall system on a large project is beyond the capability of a single designer or engineer. Partitioning of the design tasks allows multiple engineers and designers, or groups or teams of engineers and designers to work on portions of the system design. This can be facilitated through partitioning of the system graphical model into a hierarchy of multiple models representing portions or sub-systems of the overall system. Each sub-system model may be considered to be a unit model that may be independent of or dependent on other unit models. Each engineer or teams of engineers can focus on the design of one or more of these unit models. The overall system model then includes the combination and integration of all the unit models to form the overall system model.

With respect to design, the partitioning of models in a hierarchical manner facilitates teams of engineers to design complex models that may have hundreds of thousands of blocks. However, the overall graphical model needs to come together as a whole to be compiled into an executable form for execution of the entire system. Execution is used to determine and test the behavior of the system as designed by the aggregate of the graphical models. The compilation of a model with hundreds of thousands of blocks can be a task of significant size and complexity. As the size and complexity of the model increases, the model compilation process also becomes more resource intensive and time-consuming. The time and resources needed to compile a large or complex model is further compounded by the fact that execution and modeling is intended to be an interactive and iterative process. A graphical model is processed into an executable form for execution to learn and discover the system behavior of the designed model. Through execution, the designed model may be changed or refined to obtain the desired system behavior. As such, the design model is updated and the model compiled for execution repeatedly until reaching a desired solution. The benefit of the interactive and iterative nature between modeling and execution is reduced as the time to compile a model for execution increases.

Graphical models can also contain non-graphical language, such as executable instructions for a programming language. For example, a block diagram model in Simulink® can include instructions in the technical computing programming language of MATLAB®. Typically, these graphical models are compiled or converted into an executable form in a sequential manner on a single computer. That is, a hierarchical graphical model is compiled into an executable form by compiling each of the unit models subsequently one at a time on the same computer. The compilation process completes when the last unit model has completed its compilation process. Additionally, a single computer can be limiting to the size of the problem that can be solved, because of the relationship of the computing power of the computer to the computing power necessary to execute computing intensive iterative processing of complex problems in a reasonable time, such as compiling a large or complex model. With model compilation becoming a computing and time intensive task that may not be completed in a reasonable amount of time on a single computer, a solution to decrease the time for model loading, compilation, simulation, and code generation is desired.

SUMMARY OF THE INVENTION

The present invention provides systems and methods for partitioning the model compilation of a graphical model, such as a block diagram model, to distribute the processing of the tasks of the model compilation. The model compilation process provides an executable form of the graphical model that may be used for simulating and testing the design of the graphical model. The model compilation may be partitioned into tasks that can be performed concurrently on sections of the graphical model, and separately and concurrently on the same computer or on different computers. The tasks can then be distributed to one or more computers for processing. The results from the distributed processing of the tasks are obtained and combined to produce an executable form of the graphical model. In this manner, the model compilation process of graphical models can be distributed to facilitate decreasing the time to form an executable of the graphical model for simulation and testing. For example, the model compilation of a large or complex graphical model may be broken down into model processing tasks, the tasks distributed for processing across multiple computers, and task results combined to provide an executable form for execution of the graphical model.

The present invention determines from a graphical model the portions of a model compilation that can be processed separately and/or concurrently from other portions to compile the model into executable form. In one embodiment, a graphical view of the model compilation process can show a representation of separate and concurrent paths of model compilation processing that may occur. In another embodiment, the paths of model compilation may be evaluated to estimate model processing complexity of processing each path. This information may be used to determine a distribution scheme for distributing the processing of these portions in a desired manner.

Additionally, some embodiments of the present invention determine the availability and characteristics of computing resources that may be available on a network to perform model compilation processing on portions of the model. For example, computers with the lowest load and highest processing power may be identified. By comparing the processing characteristics of the model compilation paths to the characteristics of the available computing resources, another embodiment of the present invention determines a distribution scheme for processing the model compilation in a distributed and desired manner. Furthermore, in some embodiments of the present invention, the results of each distributed portion of model compilation may be obtained and combined to provide an executable form of the graphical model representing the aggregate of all the portions.

In summary, the distributed model processing of the present invention produces an executable form that can execute a simulation of the graphical model in a similar manner as an executable form that may be provided by a non-distributed model compilation of the same graphical model. However, the present invention can leverage additional computing resources and concurrent execution of portions of the model compilation process to facilitate reducing the time for model loading, compilation, simulation, and code generation of the graphical model.

In one aspect, the present invention provides a method for model processing a graphical model. The method includes the step of receiving a graphical model for model processing into an executable form. The method then determines a first section of the graphical model to perform a first portion of the model processing, and a second section of the graphical model to perform a second portion of the model processing. The first portion of the model processing can be processed concurrently with the second portion of the model processing.

In one aspect of the present invention, the graphical model may be a block diagram model and may include non-graphical or textual language. In another aspect, the method of the present invention determines the first section of the graphical model that is disjoint from the second section of the graphical model. The first section and the second section of the graphical model may be disjoint in one or more characteristics of model processing the graphical model. In another aspect, the first section and the second section may reference or identify a second graphical model associated with the graphical model. Furthermore, either the first portion or second portion of the model processing may include the model processing of the second graphical model. Additionally, the method may include the step of providing a graphical representation of portions of model processing that can be performed concurrently on sections of the graphical model.

In a further aspect, either the first or second portion of the model processing may include propagation of a signal identified in the graphical model. The propagation of the signal may include propagating an attribute of the signal of one or more of the following types: 1) a data type, 2) a dimension, 3) a sample time, 4) a frame type, and 5) a complex number type. In one aspect, the first or second portion of the model processing may provide executable instructions, code, or a shared library to form a portion of the executable form of the graphical model. Furthermore, the method may combine a result of the first portion of the model processing and a result of the second portion of the model processing to form the executable of the graphical model.

In another aspect, the present invention relates to a device readable medium having device readable instructions to execute the steps of the method, as described above, related to the model processing of a graphical model. In an additional aspect, the present invention relates to transmitting via a transmission medium computer data signals having device readable instructions to execute the steps of the method, as described above, related to the model processing of a graphical model.

In one aspect, the present invention relates to a method to distribute tasks for processing a graphical model into an executable form. The method includes the step of receiving a graphical model for model processing into an executable form. A first portion of the model processing on a first section of the graphical model can be processed concurrently with a second portion of the model processing on a second section of the graphical model. The method also includes identifying a first task of the first portion of the model processing to distribute for processing, and a second task of the second portion of the model processing to distribute for processing.

In one aspect of the present invention, the graphical model may be a block diagram model and may include non-graphical or textual language. In a further aspect, the method of the present invention also determines one or more computing devices suitable to process one of the first task and the second task. The method also includes the step of distributing the first task and the second task for processing to either a first computing device or a second computing device. The first computing device may execute an operating system different than an operating system executing on the second computing device. The method then may process at least a portion of the first task concurrently with a processing of a portion of the second task. In an additional aspect, the first task and the second task includes propagating an attribute of a signal identified in the graphical model. The attribute represents one or more of the following attribute types of the signal: 1) a data type, 2) a dimension, 3) a sample time, 4) a frame type, and 5) a complex number. Furthermore, the method combines a result of processing of the first task with a result of processing of the second task. The combining of the results provide at least a portion of the executable form of the graphical model.

In a further aspect of the present invention, either the first section or the second section of the graphical model may have a reference to a second graphical model. Additionally, either the first task or the second task includes at least a portion of model processing of the second graphical model.

In another aspect, the present invention relates to a device readable medium having device readable instructions to execute the steps of the method, as described above, related to a method to distribute tasks for processing a graphical model into an executable form. In an additional aspect, the present invention relates to transmitting via a transmission medium computer data signals having device readable instructions to execute the steps of the method, as described above, related to a method to distribute tasks for processing a graphical model into an executable form.

In one aspect, the present invention relates to a system for model processing of a graphical model. The system comprises a modeling environment and a mechanism. The modeling environment has a graphical model to model process into an executable form. The mechanism determines a first section of the graphical model and a second section of the graphical model that can be model processed concurrently. The graphical model of the present invention may be a block diagram model and may include non-graphical or textual language.

In another aspect of the present invention, the mechanism determines the first section of the graphical model is disjoint from the second section of the graphical model in one or more characteristics of model processing the graphical model. Also, the mechanism determines a first portion of model processing of the first section of the graphical model and a second portion of model processing of the second portion of the graphical model that can be processed concurrently. Additionally, the system may include a graphical user interface representing portions of model processing that can be processed concurrently on sections of the graphical model.

In a further aspect, the system of the present invention may include one or more model compilers to model process at least a section of the graphical model by performing one or more of the following signal type propagations 1) data type propagation, 2) dimension propagation, 3) sample time propagation, 4) frame type propagation and 5) complex number type propagation. The system may also include a model compiler or a code generator to provide at least one of the following to form a portion of the executable form of the graphical model: 1) executable instructions, 2) code, and 3) a shared library, or any suitable file format for the executable form. In another aspect, the system may be distributed. Each or any of the modeling environment, the mechanism, the model compiler, and the code generator may execute on one or more computing devices, such as a first computing device and a second computing device. The first computing device may execute an operating system different than an operating system executing on the second computing device.

In another aspect of the present invention, the first section or the second section of the graphical model may include a reference to a second graphical model. The model processing of the graphical model may also include the model processing of the second graphical model. Additionally, the modeling environment provides the executable form of the graphical model by combining at least a portion of results from model processing the first section and the second section of the graphical model.

In one aspect, the present invention relates to a system to distribute tasks of processing a graphical model into an executable. The system includes a modeling environment receiving a graphical model for model processing into an executable form. A first portion of the model processing on a first section of the graphical model can be processed concurrently with a second portion of the model processing on a second section of the graphical model. The system also includes a mechanism to identify a first task of the first portion of the model processing to distribute for processing. The mechanism also identifies a second task of the second portion of the model processing to distribute for processing.

In one aspect of the present invention, the graphical model may be a block diagram model and may include non-graphical or textual language. In another aspect, the mechanism of the present invention determines one or more computing devices suitable for processing a distribution of one of the first task and the second task. Additionally, the system may include a model compiler or a code generator to process either the first or second task to generate a result associated with providing a portion of the executable form of the graphical model. The system distributes the first task or the second task to either the model compiler or code generator. Either the model compiler or the code generator generates a result that includes one or more of the following: 1) executable instructions, 2) code, and 3) a shared library.

In a further aspect, the system of the present invention processes at least a portion of the first task concurrently with a processing of a portion of the second task. Furthermore, the modeling environment combines a result of processing of the first task with a result of processing of the second task. The combined results provide at least a portion of the executable form of the graphical model.

In an additional aspect of the present invention, either the first or second task includes propagating an attribute of a signal identified in the graphical model. The signal attribute represents one or more of the following: 1) a data type, 2) a dimension, 3) a sample time, 4) a frame type, and 5) a complex number. Furthermore, the first section and the second section may provide a reference to a second graphical model, and either the first or second task includes at least a portion of model processing of the second graphical model.

In an additional aspect of the present invention, the system may be distributed. Each and any of the modeling environment, the mechanism, the model compiler, and the code generator may execute on one or more computing devices, such as a first computing device and a second computing device. The first computing device may execute an operating system different than an operating system executing on the second computing device.

The details of various embodiments of the invention are set forth in the accompanying drawings and the description below.

BRIEF DESCRIPTION OF THE DRAWINGS

The foregoing and other objects, aspects, features, and advantages of the invention will become more apparent and may be better understood by referring to the following description taken in conjunction with the accompanying drawings, in which.

DETAILED DESCRIPTION

Figure 1:
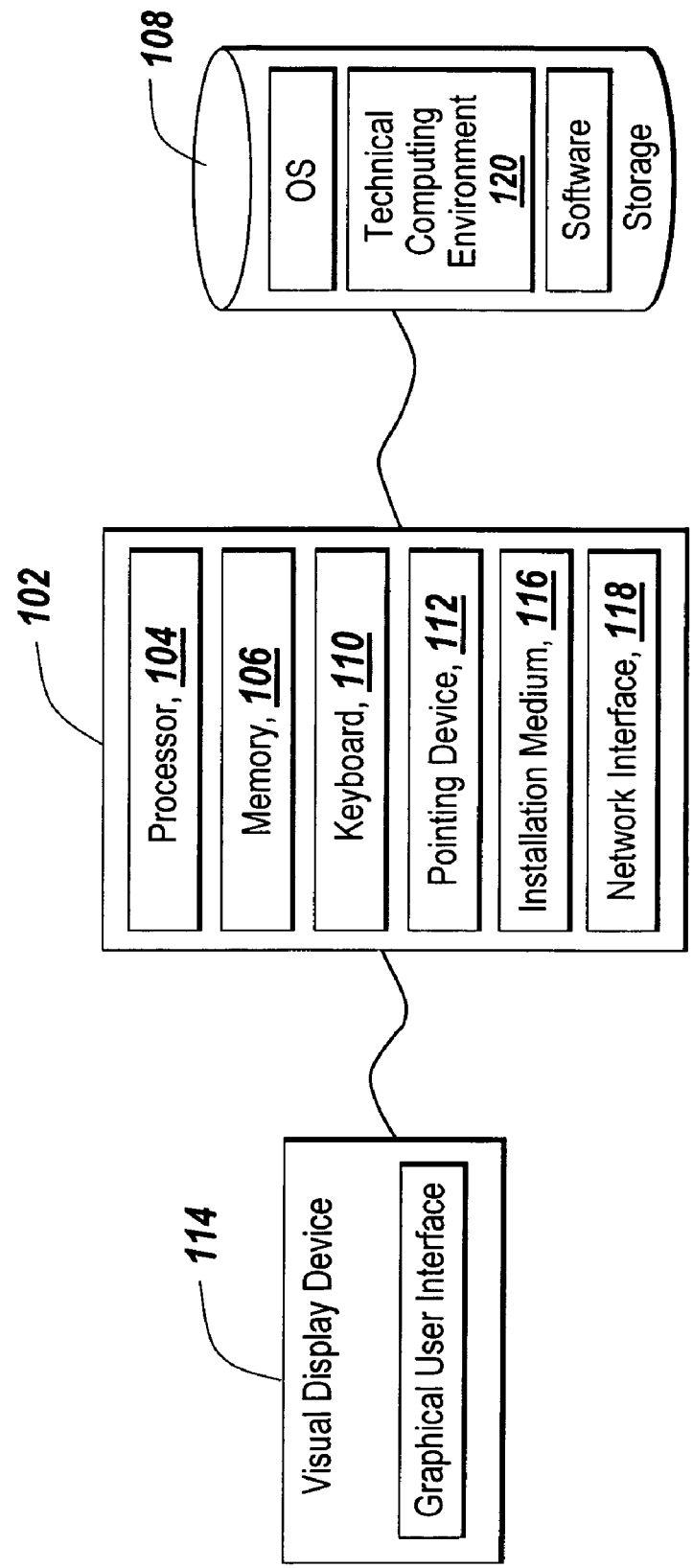
FIG. 1 is a block diagram of a computing device for practicing an illustrative embodiment of the present invention.

Certain embodiments of the present invention are described below. It is, however, expressly noted that the present invention is not limited to these embodiments, but rather the intent is that additions and modifications to what is expressly described herein also are included within the scope of the invention. Moreover, it is to be understood that the features of the various embodiments described herein are not mutually exclusive and can exist in various combinations and permutations, even if such combinations or permutations are not expressly made herein, without departing from the spirit and scope of the invention.

The illustrative embodiment of the present invention provides systems and methods for partitioning and distributing the compilation of a block diagram model to provide an executable form of the block diagram model. Model compilation converts, translates, or otherwise processes the block diagram model to provide an executable form that may be used to execute and test the block diagram model. The present invention determines from a block diagram model which tasks of a model compilation process can be processed separately and/or concurrently from other tasks. The tasks can be broken down and divided by various perspectives and granularities. In one case, a model compilation task may be the propagation of one or more attributes of a signal represented in the block diagram model. The signal attributes may be propagated across one or more blocks in the block diagram model or across multiple block diagram models representing sub-systems sharing signals. In another case, a model compilation task may include the compilation of a unit block diagram model that is a sub-system of a hierarchical block diagram model. A first unit block diagram model may be disjoint from a second block diagram model associated with the same top level block diagram model. That is, they may not have any dependencies or relationships to each other, such as sharing signals or data that may prevent them from being compiled separately. In this case, each of these unit block diagram model may be model compiled separately and/or concurrently to each other. A graphical tree view of model compilation of the block diagram model can be shown with the branches of the tree representing separate and/or concurrent model compilation paths.

Additionally, the illustrative embodiment of the present invention determines a distribution scheme for distributing the processing of the model compilation tasks to form an executable for the block diagram model. The model compilation tasks or branches of the graphical tree representation can be evaluated to determine the computational and spatial complexity in performing or otherwise processing the model compilation task. For example, the present invention may consider the number of blocks and signals to process for the task, the size and complexity of the code to represent the functionality of each block, and the signal attributes to be propagated and to what extent. Furthermore, the present invention determines the availability and characteristics of computing resources that may be available on a network to perform model compilation processing. For example, the speed of processors and current loading of a computing device may be considered. A distribution scheme can be determined that considers the processing characteristics of the model compilation tasks in view of the characteristics of the available computing resources. Variations of distribution schemes can be determined to distribute model compilation tasks for processing in an optimized or desired manner.

Furthermore, the present invention provides for obtaining and combining the results of the distributed processing of the model compilation tasks to provide an executable form for the block diagram model. In this manner, although the model compilation of the block diagram model was divided into tasks and distributed, the end result is that an executable form for the block diagram model is provided. The results of the distributed tasks can be loaded in a suitable manner in order to provide the executable form. Then, the executable form can be executed to simulate the block diagram model to view and test the behavior of the design of the block diagram model.

The illustrative embodiment will be described solely for illustrative purposes relative to the technical computing environment of MATLAB®, and the Simulink® product family including Stateflow® from The MathWorks, Inc. of Natick, Mass. Although the illustrative embodiment will be described relative to a MathWorks-based application, one of ordinary skill in the art will appreciate that the present invention may be applied to other graphical modeling environments and technical computing environments, such as any graphical modeling or technical computing environments using software products of LabVIEW®, MATRIXx from National Instruments, Inc., Mathematica® from Wolfram Research, Inc., Mathcad of Mathsoft Engineering & Education Inc., Maple™ from Maplesoft, a division of Waterloo Maple Inc., Dymola from Dynasim AB of Lund, Sweden, or MSC.Adams® from MSC.Software Corporation of Santa Ana, Calif. Furthermore, one ordinarily skilled in the art will appreciate that the present invention may apply to any graphical or text-based modeling environment, such as one providing modeling with a Unified Modeling Language (UML), Hardware Descriptive Language (HDL), or that provides a physics modeling domain.

FIG. 1 depicts an environment suitable for practicing an illustrative embodiment of the present invention. The environment includes a computing device 102 having memory 106, on which software according to one embodiment of the present invention may be stored, a processor (CPU) 104 for executing software stored in the memory 106, and other programs for controlling system hardware. The memory 106 may comprise a computer system memory or random access memory such as DRAM, SRAM, EDO RAM, FLASH RAM, etc. The memory 106 may comprise other types of memory as well, or combinations thereof. A human user may interact with the computing device 102 through a visual display device 114 such as a computer monitor, which may be used to display a graphical user interface (GUI). The computing device 102 may include other I/O devices such a keyboard 110 and a pointing device 112, for example a mouse, for receiving input from a user. Optionally, the keyboard 110 and the pointing device 112 may be connected to the visual display device 114. The computing device 102 may include other suitable conventional I/O peripherals. For installing software programs, the computing device 102 may support any suitable device readable medium 116, such as a CD-ROM, DVD-ROM floppy disks, tape device, USB device, hard-drive or any other suitable device. The computing device 102 may further comprise a storage device 108, such as a hard-drive or CD-ROM, for storing an operating system and other related software. The present invention of a technical computing environment 120 may comprise software that is installed via a device readable medium 116 and stored in the storage device 108. Additionally, the operating system and technical computing environment 120 can be run from a bootable CD, such as, for example, KNOPPIX®, a bootable CD for GNU/Linux.

Additionally, the computing device 102 may include a network interface 118 to interface to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM), cluster interconnection (Myrinet), peripheral component interconnections (PCI, PCI-X), wireless connections, or some combination of any or all of the above. The network interface 118 may comprise a built-in network adapter, network interface card, PCMCIA network card, card bus network adapter, wireless network adapter, USB network adapter, modem or any other device suitable for interfacing the computing device 118 to any type of network capable of communication and performing the operations described herein. Moreover, the computing device 102 may be any computer system such as a workstation, desktop computer, server, laptop, handheld computer or other form of computing or telecommunications device that is capable of communication and that has sufficient processor power and memory capacity to perform the operations described herein.

Figure 2A:
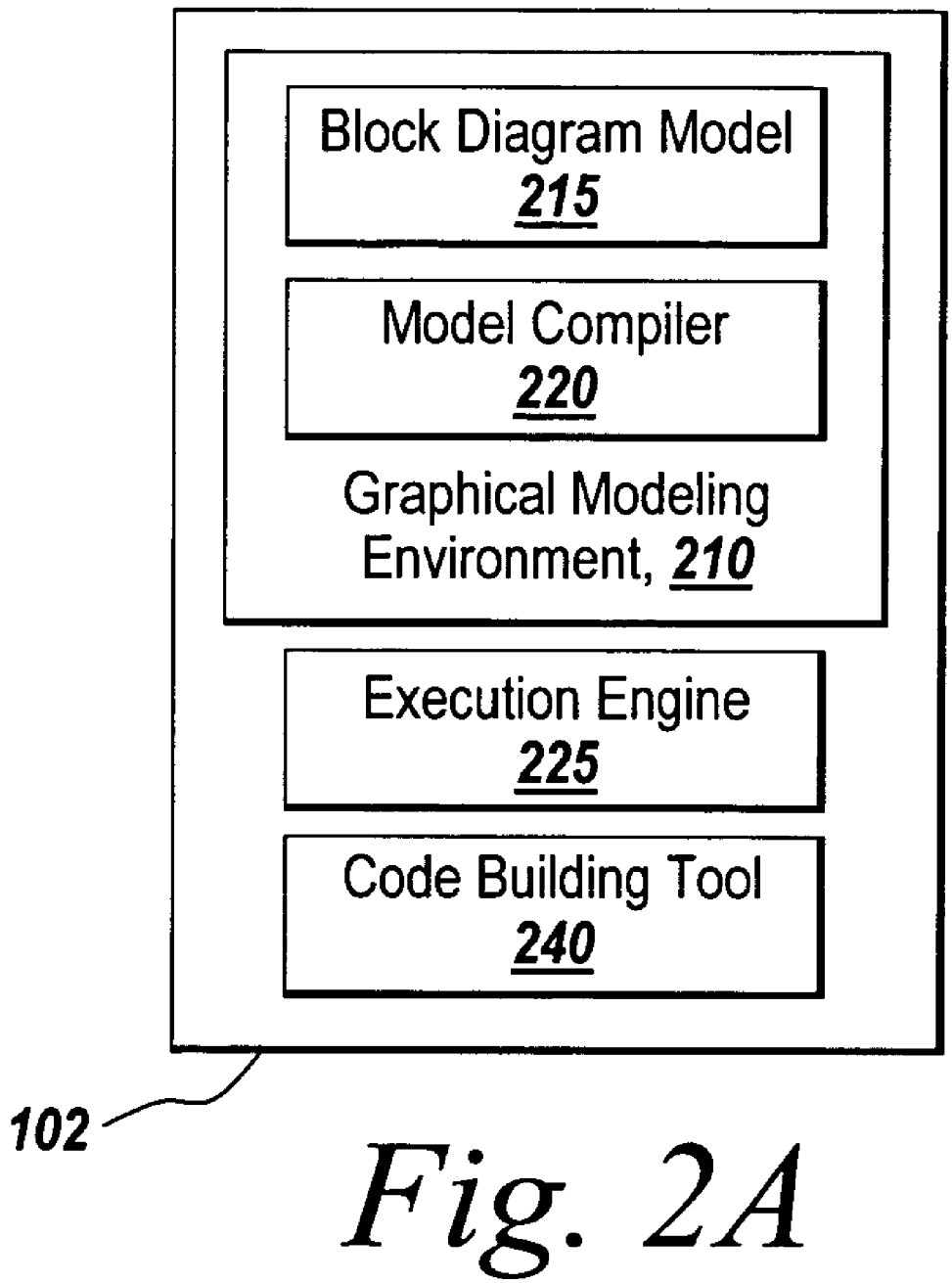
FIG. 2A is a block diagram of an embodiment of the present invention in a single computing device.

The illustrative embodiment of the present invention is directed towards a technical computing environment 120 having a graphical modeling environment and a code building tool. Referring now to FIG. 2A, an illustrative embodiment of a system for practicing the present invention is depicted. In brief overview, the technical computing environment 120 includes a graphical modeling environment 210 and code building tool 240, which are capable of and configured to execute on the computing device 102. The computing device 102 may be any type of computing device as described above, and as depicted in FIG. 2A may be a standalone system or a single node in a computer network.

The graphical modeling environment 210 may comprise a platform for multi-domain simulation and model-based design of dynamic systems, algorithms, computations, implementations of software and/or hardware, and any other naturally occurring or man-made system. In the graphical modeling environment 210, customizable functional blocks are used to create a block diagram model 215 that may represent one or more computations, algorithms or operations that can be performed on a computational hardware device, such as a computer, embedded system, processor or any other type of integrated circuit. The graphical modeling environment 210 includes a graphical user interface for interactively creating and working with a block diagram model 215 and may also provide for simulating, testing and verifying a block diagram model 215. In an exemplary embodiment, the graphical modeling environment 210 is a graphical modeling environment 210 like Simulink® from the MathWorks, Inc. of Natick, Mass.

The graphical modeling environment 210 may also provide for a non-graphical language to be included in the block diagram model 215. For example, a block diagram model 215 created in Simulink® may contain programming language statements or instructions in the technical computing language of MATLAB®. In another embodiment, a non-graphical or textual language, such as embedded MATLAB®, may be used to implement one or more elements of the block diagram model 215. In this manner, a graphical model such as the block diagram model 215 may comprise graphical and non-graphical elements, and the non-graphical elements may include any type of suitable text, such as any programming language. One ordinarily skilled in the art will recognize and appreciate that the present invention can be practiced with any type of graphical model 215 from any graphical modeling environment 210, and that the graphical model 215 may also include a non-graphical language of any type.

The graphical modeling environment 210 includes a model compiler 220 for compiling the block diagram model 215 to convert, translate, or otherwise process the block diagram model 215 into an executable form. The executable form may be used to execute a simulation of the block diagram model 215 to test and verify the system behavior of computations, algorithms or operations of the block diagram model 215. In one embodiment, the model compiler 220 provides an interpretative language executable representation of the block diagram model 215. This may be referred to as normal or interpretative mode of execution or simulation. The model compiler 220 may process the block diagram model 215 to execute in an interpretative language, or any other executable instructions readable and executable by the graphical modeling environment 210, or another execution environment suitable for executing the executable instructions. For example, the model compiler 220 may provide executable instructions for the block diagram model 215 in the technical computing programming language of MATLAB®, in a Virtual Hardware Description Language (VHDL), or any other interpretative language. These executable instructions would represent the functionality of the block and signals of the block diagram model 215 in a suitable manner to execute the block diagram model 215.

The technical computing environment 120 may also include an execution engine 225 for executing the executable instructions provided by the model compiler 220. In one embodiment, the execution engine 225 is included in or associated with the graphical modeling environment 210. The execution engine 225 may allocate any memory on the computing device 102 needed for execution of the executable form of the block diagram model 215. The execution engine 225 may also allocate and initialize memory for any data structures that store run-time information for each block represented in the executable form. For example, some of these data structures may include pointers to a block's input and output buffers and state vectors. In general, the execution engine 225 may be any type of run-environment capable of providing an execution environment to read and execute any of the executable instructions provided by the model compiler 220 as the executable form of the block diagram model 215.

The model compiler 220 may convert, translate, or otherwise process the block diagram model 215 as may be necessary to form an executable that will simulate or execute the system represented by the block diagram model 215. A simulation, or execution, will compute the system's inputs, outputs and states as they may vary over a span of time. In one embodiment, the input to the system may be provided via an interfacing mechanism. By way of example of the exemplary embodiment of the graphical modeling environment 210 of Simulink®, the model compiler 220 may perform one or more of the following steps: 1) evaluate the block diagram model's 215 block parameter expressions to determine their values, 2) determine signal attributes, e.g., name, data type, numeric type, and dimensionality, not explicitly specified by the block diagram model 215 and checks that each block can accept the signals connected to its inputs, 3) perform attribute propagation to determine unspecified attributes, 4) perform block reduction optimizations, 5) flatten the block diagram model 215 hierarchy by replacing subsystems with blocks, 6) sort the blocks into an execution order for execution/simulation, 7) determine samples time for blocks in the block diagram model 215 which do not have explicitly defined sample times, and 8) determine a block update order for updating the blocks during execution. One ordinarily skilled in the art will appreciate the steps performed by the model compiler 220 in the graphical environment 210 of Simulink®, and will further appreciate the wide range of different steps that a model compiler 220 in any graphical modeling environment 210 may need to perform in order to process the block diagram model 215 into an executable form, an intermediate form, or any desired and suitable form.

The technical computing environment 120 may also have a code building tool 240 to generate code, such as source code, object code, a compiled executable, or library, for forming an executable of the block diagram model 215. This may be referred to as an accelerated mode of execution or simulation. Generally, this non-interpretative form of code will execute faster than the interpretative executable form. However, it may take longer to generate code for the accelerated mode thereby increasing model compilation time for simulation execution speed. In an exemplary embodiment, the code building tool 240 may comprise a code building tool like Real-Time Workshop® from The MathWorks, Inc. of Natick, Mass., or any portion thereof that may be necessary to generate executable code, instructions, etc. in a programming language such as C. The code building tool 240 can generate source code for the execution of the block diagram model 215, compile the source code into object code and build an executable program, library or any other form of executable instructions. The code may be designed to run on any processor, microprocessor, operating system, computational hardware device or component of a computational hardware device. In one embodiment, the code may comprise embedded code targeted to run on any type of embedded system. Additionally, the code may be customized to run on a specific target hardware platform.

In an exemplary illustration of code building operations, the code building tool 240 reads in the block diagram model 215 to translate the block diagram model 215 into one or more source code files. The code building tool 240 may receive or obtain the block diagram model 215 stored in memory of the graphical modeling environment 210 via any suitable interface mechanism. Alternatively, the code building tool 240 may read the block diagram model 215 from storage such as a model file, i.e., .mdl file, stored by Simulink®, or any other representation of the block diagram model 215, such as an intermediate block diagram model 215 representation in an .rtw file of Real-Time Workshop®. The code building tool 240 may use any form of input files to generate code for translating the blocks and signals of the block diagram model 215 into one more or source code files. The source code files may include program instructions of any suitable programming language, such as C, which may further be in a format and style following the ANSI/ISO C standard. Additionally, the source code files may be generated to comprise fixed-point or floating-point source code. In a further embodiment, the programming instructions of the source code may be optimized for performance or versatility, and/or for a specific target hardware platform. In another embodiment, the code building tool 240 can be configured via any input or configuration files to generate custom source code comprising a style and format. The code building tool 240 can be also configured via input files to provide customized source code to support such customizations as error handling, optimization, code and data reduction, code reusability, scoping of variables, and other characteristics of the source code that may be modified during the source code generation process.

The code building tool 240 also provides for the building of the source code files into object code to generate one or more programs, libraries or other forms of executable instructions to run an executable form of the block diagram model 215. The build process may include compiling the code and linking libraries, drivers and other programs via a make program or some other compiling utility. In some embodiments, the code building tool 240 may include linking of a user provided device driver, or other user provided executable instructions when compiling the source code into object code. Although this illustrative example of the code building tool 240 is discussed in terms of source code files and object code from a programming language like C, the code building tool 240 may generate any type of programming related output, such as an interpreted programming language and/or scripting language. For example, the code generator 420 may generate code for perl, awk, VBscript, Javascript, tcl, or the technical computing programming language of MATLAB®. One ordinarily skilled in the art will recognize the various types of languages the code building tool may apply in generating code and how the code generator may build the code based on the type of language to provide an executable form of the block diagram model 215.

The executable instructions from the code building tool 240 may be provided in such a manner as to allow the graphical modeling environment 210 to invoke the executable instructions. For example, the executable instructions may be linked into the graphical modeling environment 210 via a function or an application programming interface call, or by linking in or loading in a library. In accelerated mode, the graphical modeling environment 210 may not require the execution engine 225 as the executable instructions are not written in an interpretative language. One ordinarily skilled in the art will appreciate the various ways that the graphical modeling environment 210 may invoke executable instructions representing the block diagram model 215.

The graphical modeling environment 210, model compiler 220, execution engine 225 and/or the code building tool 240 can be an application, module, software component, library, service, process, task or any other form of executable instructions which is designed to and capable of executing the functionality as described herein. Furthermore, the model compiler 220 may be separated from the graphical modeling environment 210 and may comprise an application, module, service, software component or any other type of computer program. Additionally, the graphical Modeling environment 180 may be configured to and capable of running any of the modules, libraries or software components of the MATLAB® and Simulink® product families. As such, the graphical modeling environment 210 may have all or a portion of the software components of MATLAB® and/or Simulink® installed on the computing device 102, or alternatively, accessible from another computing device on a network.

Figure 2B:
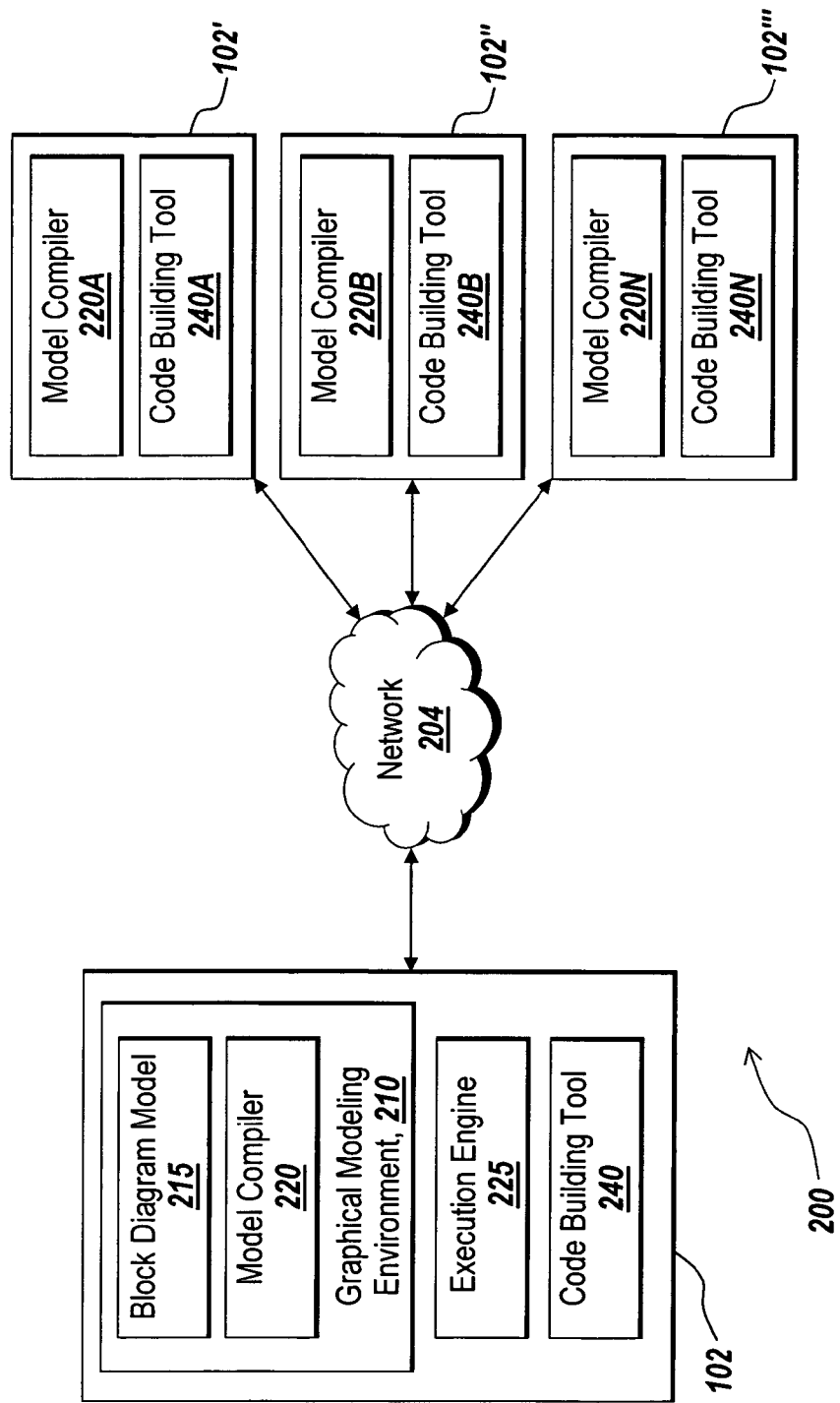
FIG. 2B is a block diagram of an embodiment of the present invention distributed in a network of multiple computing devices.

FIG. 2B depicts another environment suitable for practicing an illustrative embodiment of the present invention, where the graphical modeling environment 210 and the code building tool 240 is deployed in a networked computer system 200. In a broad overview, the networked system 200 depicts a multiple node network 204 for running in a distributed manner the graphical modeling environment 210 and the code building tool 240 of the present invention. The system 200 includes multiple computing devices 102-102''', may generally be referred herein as computers, connected to and communicating over a network 204. The network 204 can be a local area network (LAN), such as a company Intranet, a metropolitan area network (MAN), or a wide area network (WAN) such as the Internet. In one embodiment (not shown), the network 204 comprises separate networks, which may be of the same type or may be of different types. The topology of the network 204 over which the computing devices communicate may be a bus, star, or ring network topology. The network 204 and network topology may be of any such network 204 or network topology capable of supporting the operations of the present invention described herein.

The computers 102-102''' can connect to the network 204 through a variety of connections including standard telephone lines, LAN or WAN links (e.g., T1, T3, 56 kb, X.25, SNA, DECNET), broadband connections (ISDN, Frame Relay, ATM, Gigabit Ethernet, Ethernet-over-SONET), cluster interconnections (Myrinet), peripheral component interconnections (PCI, PCI-X), and wireless connections, or some combination of any or all of the above. Connections can be established using a variety of communication protocols (e.g., TCP/IP, IPX, SPX, NetBIOS, Ethernet, ARCNET, Fiber Distributed Data Interface (FDDI), RS232, IEEE 802.11, IEEE 802.11a, IEEE 802.11b, IEEE 802.11g, and direct asynchronous connections). The network connection and communication protocol may be of any such network connection or communication protocol capable of supporting the operations of the present invention described herein.

In the network 204, each of the computers 102-102''' are configured to and capable of running at least a portion of the present invention. As a distributed application, the present invention may have one or more software components that run on each of the computers 102-102''' and work in communication and in collaboration with each other to meet the functionality of the overall operations of the present invention as described herein. Each of the computers 102-102''' can be any type of computing device as described in connection with FIG. 1, and respectively configured to be capable of computing and communicating the operations described herein. For example, any and each of the computers 102-102''' may be a server, a multi-user server, server farm or multi-processor server. In another example, any of the computers 102-102''' may be a mobile computing device such as a notebook or PDA. One ordinarily skilled in the art will recognize the wide range of possible combinations of types of computing devices capable of communicating over a network.

The network 204 and network connections may include any transmission medium between any of the computers 102-102''', such as electrical wiring or cabling, fiber optics, electromagnetic radiation or via any other form of transmission medium capable of supporting the operations of the present invention described herein. The methods and systems of the present invention may also be embodied in the form of computer data signals, program code, or any other type of transmission that is transmitted over the transmission medium, or via any other form of transmission, which may be received, loaded into, and executed, or otherwise processed and used by any of the computers 102-102''' to practice the present invention.

Each of the computers 102-102''' may be configured to and capable of running the graphical modeling environment 210 and/or the code building tool 240. The graphical modeling environment 210 and the code building tool 240 may run together on the same computer 102, or may run separately on different computers 102 and 102'. Furthermore, the graphical modeling environment 210 and/or the code building tool 240 can be capable of and configured to operate on the operating system that may be running on any of the computers 102 and 102'. Each computer 102-102''' can be running the same or different operating systems. For example, computer 102 can be running Microsoft® Windows, and computer 102' can be running a version of UNIX, and computer 102'', a version of Linux. Or each computer 102-102''' can be running the same operating system, such as Microsoft® Windows. In this manner, the present invention may be distributed and performed across multiples computers in a heterogeneous or homogenous networked system 200 to practice the operations of the present invention as described herein.

Additionally, the graphical modeling environment 210 and code building tool 240 can be capable of and configured to operate on and take advantage of different processors of any of the computing device. For example, the graphical modeling environment 210 can run on a 32 bit processor of one computing device 102 and a 64 bit processor of another computing device 102'. Furthermore, the graphical modeling environment 210 and/or code building tool 240 can operate on computing devices that can be running on different processor architectures in addition to different operating systems. One ordinarily skilled in the art will recognize the various combinations of operating systems and processors that can be running on any of the computing devices. In summary, one ordinarily skilled in the art will appreciate that the graphical modeling environment 210 and code building tool 240 may be deployed across a wide range of different computing devices, different operating systems and different processors in various network topologies and configurations.

In one aspect, the present invention is directed towards the distribution of model compilation processing. As depicted in the networked system 200 of FIG. 2B, multiple model compilers 220-220n and multiple code building tools 240-240n may be deployed to computing devices 102'-102''' in order to support distributed processing of a model compilation of the block diagram model 215. As such, each of the model compilers 220a-220n and code building tools 240-240n can be capable of and configured to perform one or more tasks of model compilation to support the interpretative and accelerated modes of simulation execution. Although computing device 102'-102''' are shown with model compilers 220a and code building tools 240a, the computing devices 102'-102''' may each have a graphical modeling environment 210 or technical computing environment 120 of the present invention, or any portions thereof.

Each of the model compilers 220a-220n may be in communication with the model compiler 220, the graphical modeling environment 220 or the technical computing environment 120 on the computing device 102. Likewise, each of the code building tools 240a-240n may be in communication with the code building tool 240, the graphical modeling environment 220 or the technical computing environment 120 on the computing device 102. Any suitable interface means or mechanisms may be used for the communications between the graphical modeling environment 210, the technical computing environment 120, and the model compiler 220 on the computing device 102 over the network 204 to any of the model compilers 220a-220n and the code building tools 240a-240n on computing devices 102'-102'''. One ordinarily skilled in the art will appreciate the various ways the present invention may be distributed in a networked system 200, and how any of the components of the present invention may communicate with each other.

Figure 2C:
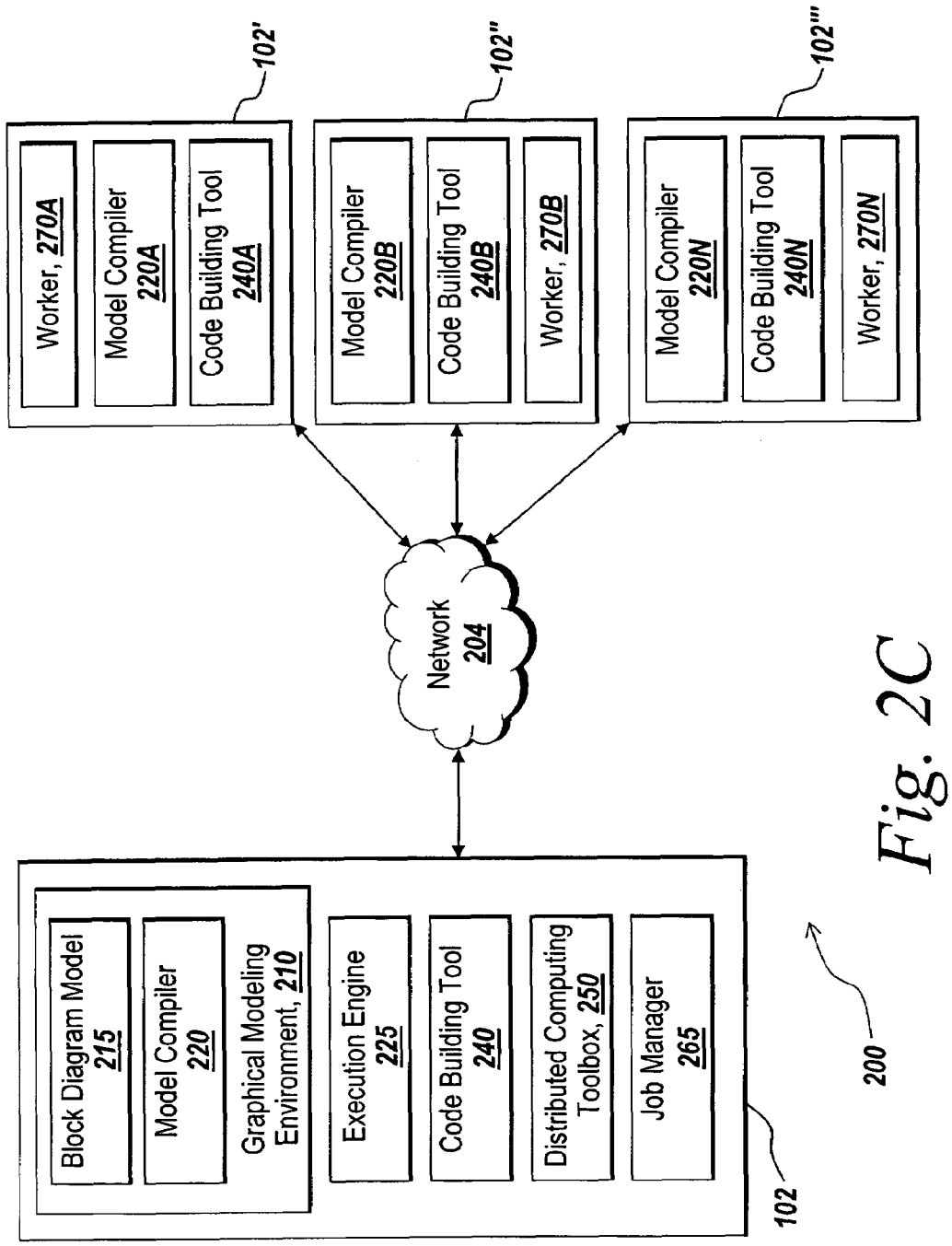
FIG. 2C is a block diagram of another embodiment of the present invention in a networked system including a distributed computing environment.

In an exemplary embodiment as depicted in FIG. 2C, the system 200 may also include additional components for distributing and managing distributed model processing tasks in accordance with the operations of the present invention described herein. In some embodiments, the technical computing environment 120 is a distributed MATLAB® environment as disclosed in co-pending U.S. patent application Ser. No. 10/896,784, titled "Methods And Systems For Distributing Technical Computing Tasks To Technical Computing Workers and filed Jul. 21, 2004, and co-pending U.S. patent application Ser. No. 10/940,151, titled "Interfaces To Job Managers In Distributed Computing Environments" and filed Sep. 13, 2004, both of which are incorporated herein by reference in their entirety. In one embodiment as depicted in system 200 of FIG. 2C, the technical computing environment 120 of the present invention includes the Distributed Computing Toolbox, or distributed computing toolbox 250, and the MATLAB® Distributed Computing Engine, of the MATLAB® product family. The MATLAB® Distributed Computing Engine comprises a job manager 265 and a technical computing worker, or worker 270. In brief overview of system 200 of FIG. 2C, the computing device 102 includes a distributed computing toolbox 250 and a job manager 265, and each of the computing devices 102'-102''' include a technical computing worker, or worker 270a-270n.

The distributed computing toolbox 250 and job manager 265 works with the worker 270 to distribute tasks related to processing models in the graphical modeling environment 210, such as a graphical modeling environment 210 provided by Simulink®, to a cluster of computing devices 102. As such, models and applications can be developed in the technical computing environment 120 of MATLAB® and the Distributed Computing Toolbox 250 can be used to divide them into independent tasks and distribute the tasks to workers 270a-270n for evaluation or execution. The workers 270a-270n can perform these tasks on remote computing devices 102'-102'''. The distributed computing toolbox 250, together with the workers 270a-270n, can substantially reduce the overall execution time for distributing and processing tasks of the present invention as described herein.

The distributed computing toolbox 250, job manager 265 and workers 270a-270n manage, distribute, process and obtain results using jobs and tasks. A job may be a complete operation, such as the model compilation or processing of a block diagram model, to perform in the technical computing environment 120. The job comprises a set of tasks, where a task is one portion of the job to be evaluated or performed by the worker 270. In the graphical modeling environment 210, jobs and tasks can be defined using the distributed computing toolbox 250. The distributing computing toolbox 250 provides functions and/or an application programming interface (API), for example, an object-oriented interface, to define jobs and tasks, to submit tasks and jobs for distribution and to receive results from an executed task or job. For example, a job object comprising tasks or tasks objects can be defined via the distributed computing toolbox 250. The distributed computing toolbox 250 can run on any computing device 102 on the network 204 from which a graphical modeling environment 210 is provided to define and submit jobs. Additionally, multiple distributed computing toolboxes 250 can be running on the network 204 and on any type of hardware and operating system platform. For example, one technical computing toolbox 250 can be running on a Windows platform with the graphical modeling environment 210 and another distributed computing toolbox 250 can be running on a Linux platform with another graphical modeling environment 210.

The job manager 265 can run on any computing device 102 on the network and coordinates job execution. The job manager 265 can accept jobs from any distributed computing toolbox 250 and asynchronously distributes tasks to workers 270a-270n for execution. On startup, workers 270a-270n can be registered with a job manager 265 and have a unique name associated with the worker 270a-270n. In the case of processing tasks related to model processing or compilation, or generating an executable form from a model, each of the workers 270a-270n may be in communication with a model compiler 220-220n and/or code building tool 240-240n in order to perform the task. In other embodiments, the model compiler 220-220n and/or code building tool 240a-240n is included in or a part of the worker 270a-270n. Once the workers 270a-270n complete their tasks, the workers 270a-270n send results to the job manager 265, where the results can be obtained or made available via the distributed computing toolbox 250. For example, the graphical modeling environment 210 can obtain the results of a job to compile a model from the job manager 265 via the distributed computing toolbox 250.

Multiple job managers 265 can be running on the network 204 to service one or more distributed computing toolboxes 250. Additionally, the multiple job managers 265 can be on any type of hardware and operating system platform, and each of the job managers 265 can be running on the same or a different platform from the other job managers 265. Furthermore, the distributed computing toolbox 250, the job manager 265 and each of the workers 270a-270n can each be on different hardware and operating system platforms. That is, the distributed computing toolbox 250, the job manager 265 and each of the workers 270a-270n do not need to be on the same type of operating system or hardware platform in order to work in conjunction with each other.

Although the distributed computing toolbox 250, job manager 265, and workers 270a-270n are illustrated by an example of a technical computing environment 120 of MATLAB® using the Distributed Computing Toolbox 250 and the MATLAB® Distributed Computing Engine, one ordinarily skilled in the art will recognize and appreciate that any suitable distribution tool, mechanisms and means may be used.

Figure 3A:
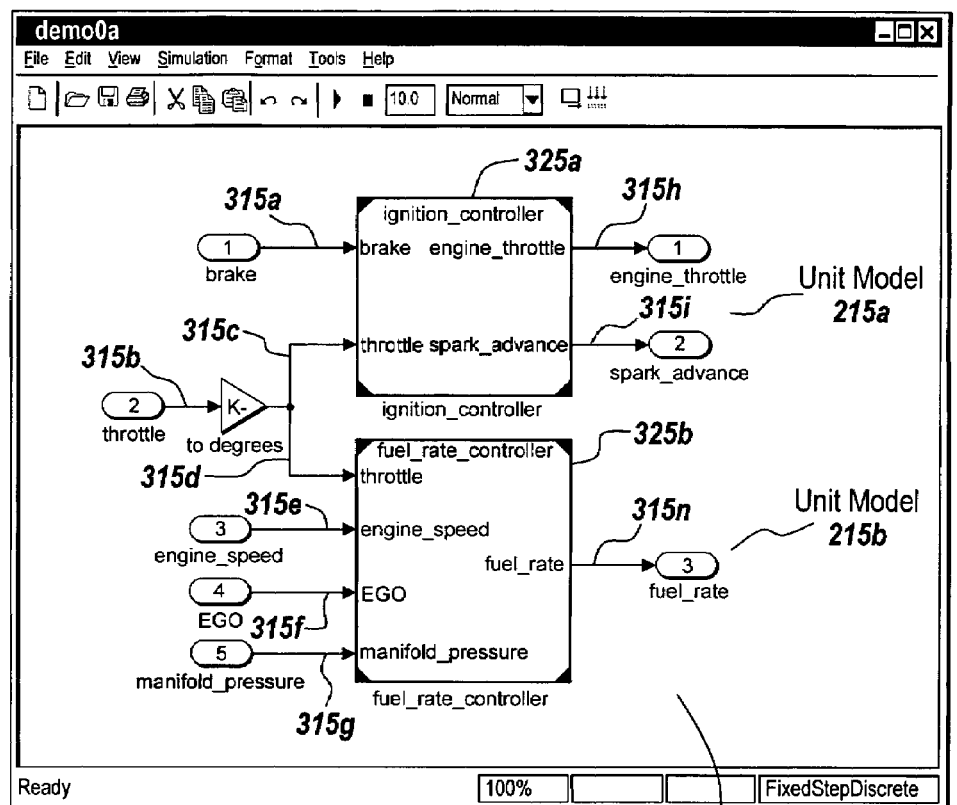
FIG. 3A is a block diagram illustrating an example of a graphical model that may be used in practicing the present invention.

Referring now to FIG. 3A, an example block diagram model 215 is shown for an embodiment of the present invention. Although this block diagram model 215 will be generally discussed and used as a reference for discussions herein, any block diagram model 215 may be used to practice the invention. For example, any block diagram model 215 that may be generated with the graphical modeling environment 210, such as Simulink®, may be used. In FIG. 3A, the block diagram model 315 represents an illustrative graphical model of an engine controller for an automotive power train. This controller represented by the design in the block diagram model 215 may also include a design for an ignition controller and a fuel rate controller. For example, the ignition controller may be designed in the block diagram model 215 to compute the actual engine throttle setting and the spark advance to control performance of the engine. The fuel rate controller may be designed in the block diagram model 215 to set the rate of fuel supply to the engine to minimize pollution of the vehicle from the combustion process.

Since the design of the ignition controller and the fuel rate controller can be disjoint from each other, the designs for these controllers can be separated into different unit or stand-alone block diagram models. In the overall engine controller design, the block diagram model 215 is the top model or top view model. The model block 325a can provide a model reference to a second block diagram model representing the design of the subsystem of the ignition controller. Likewise, the model block 325b can provide a model reference to a third block diagram model representing the design of the subsystem of the fuel rate controller. These second and third block diagram models could be stand-alone block diagram models 215 but they are sub-systems in that they are referenced by the top block diagram model 215 of the engine controller. As such, the top block diagram model 215 forms a hierarchical or multi-layer block diagram model structure in that there is a top model, i.e., engine controller, which references two additional disjoint unit block diagram models, i.e., the ignition and fuel-rate controllers. Although blocks 325a and 325b are referred to as model reference blocks, they can also be subsystem blocks as they are known in the graphical modeling environment 210 of Simulink®. One ordinarily skilled in the art will recognize the various elements may be used in the block diagram model 215 to reference, represent, or otherwise identify a sub-system, or unit block diagram model that forms a second or higher layer to the top level hierarchy of the block diagram model 215.

Figure 3B:
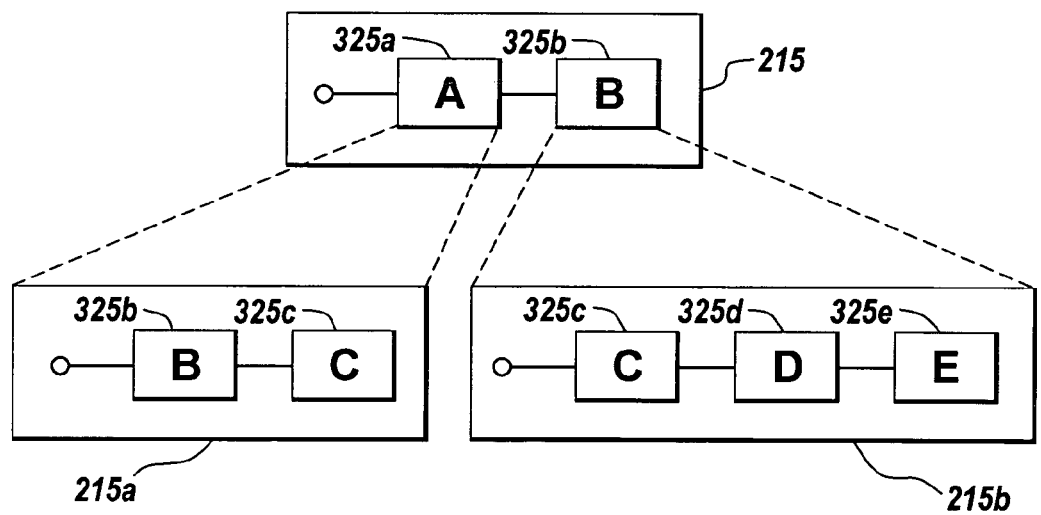
FIG. 3B is a block diagram illustrating another example of a graphical model that may be used in practicing the present invention.

Referring now to FIG. 3B, an illustrative hierarchical view of the example block diagram model 215 is shown. The block diagram model 215 includes a first model reference block 325a referencing a block diagram model "A" 215a, and a second model reference block 325b referencing a block diagram model "B" 215b. In turn, the "A" block diagram model 215a may include one or more model reference blocks 325b and 325c. For example, model reference block 325b may also reference the "B" block diagram model 215b and a third block diagram model "C" may be referenced by model reference block 325c. Alternatively, the "A" block diagram model 215a may comprise two functional blocks 325b and 325c that do not reference any additional block diagram models. Likewise, the "B" block diagram model 215b may include one or more model reference blocks 325c-325e. For example, model reference block 325c may reference a third block diagram model of "C", and model reference blocks 325d and 325e may each reference a fourth block diagram model "D", and a fifth block diagram model "E." Alternatively, any of the blocks of 325c-325e may represent functional blocks of the block diagram model 215. In this manner, the block diagram model 215 represents the top level of the model hierarchy and each of block diagram models 215a and 215a are unit block diagram models representing a sub-system of the top model and a second layer to the hierarchy. Block diagram models "C", "D", "E" referenced by model reference blocks 325c-325e could represent additional unit models and a third layer to the hierarchy. As mentioned above, although referred to as a model reference block 325a-325b, the block diagram model 215 may comprise any element that identifies a sub-system, unit block diagram model, another block diagram model, or any portion of a block diagram model. Additionally, one ordinarily skilled in the art will recognize that the block diagram model 215 can have a multitude of layers, unit block diagram models, and sub-systems.

Referring back to the block diagram model 215 of FIG. 3A, the model reference blocks 325a and 325b are integrated into the top view by a shared throttle input represented via a signal element 315b. In the block diagram model 215, the signals 315a-315n are identified by lines with arrow heads and represent inputs and outputs to the model reference blocks 325a and 325b. Additionally, the signals can represent input and output signals to any types of blocks of the block diagram model 215. A signal as used herein will be in reference to signals used in the graphical modeling environment 210 of Simulink®, although one ordinarily skilled in the art will appreciate that other graphical modeling environments 210 may have other representations for signal like functionality as described herein. Signals represent streams of information, such as data, data types, timing information, and control information, flowing into, out of, and between various blocks in the block diagram model 215. For example signal 315a can represent attributes related to the application of a brake to the ignition controller while signal 315h provided attributes related to an engine throttle output.

In the graphical modeling environment 210, signals can be specified with a wide range of attributes including signal name, data type (e.g., 8-bit, 16-bit, or 32-bit integer), numeric type (complex or real) and dimensionality. A signal type refers to a signal that is a member of a class or classes of signals. The dimensionality attribute of a signal has a value or values that identify the maximum dimensions of the data represented by the signal. The data can be organized into a one-dimensional data structure for example, a vector or can be organized into a two-dimensional data structure, for example, a matrix, or can be organized into a three-dimensional or four-dimensional data structure. Additionally, the data dimensionality of a signal can vary during execution of a block diagram 215 in the graphical model environment 210. As such, the data dimensions of a signal may vary to accommodate the dimensionality requirements of data, a function, or to comply with the attributes of the signal as configured in the block diagram model 215.

Many blocks of the block diagram model 215 can accept input signals 315a-315g or provide output signals 315h-315n of any data, numeric or dimensionality type. Each distinct input or output on a block 325a-325b is referred to as a port. A port provides a link of the signal to the block, i.e., an input port, or out from the block, i.e., an output port. Signals correspond to the time-varying quantities represented by each line connection and are assumed to have values at each time instant. The destination of the signals 315a-315g corresponds to blocks 325a-325b that read from the signal during execution of the block 325a-325b. The source of the signals 315g-315n correspond to the blocks 325a-325b that write to the signal during block execution. Furthermore, processing of these signals within a graphical model environment 215 is adaptable to recognize the signal attributes and any variability to the signals during execution, such as variable data dimensionality.

During model compilation, the graphical modeling environment 210, such as through the model compiler 220, uses a process called signal propagation to represent the traversal of the signal and associated attributes via the connectivity of the blocks. This may be needed for creating the executable form of the block diagram model 215 to simulate the behavior of the signal through the blocks of the block diagram model 215. As such, the propagation of signal attributes through the connectivity represented in the block diagram model 215 drive the execution of the simulation. In reference to an exemplary embodiment of Simulink® as the graphical modeling environment 210, signal propagation is the process used to determine attributes of signals and blocks, such as data types, labels, sample time, dimensionality, and so on, that are determined by connectivity. Since a signal 325a-325n can have different types of associated attributes, there are also different types of signal propagation that may occur when compiling the model.

One type of signal propagation is data type propagation. This processing step involves determining the types of signals whose data type is not otherwise specified and checking the data types of signals and input ports of blocks to ensure that they do not conflict. This is to make sure the data type of the signal propagating through the connected blocks can be handled and processed by the blocks in accordance with the functionality or operations of the block. For example, certain blocks may only receive as input a certain data type, but nevertheless may be connected to a signal with data type attributes that cannot be processed by the block. In some embodiments of data type propagation, data types may be typecast or converted from one data type to the required data type for use by certain blocks. Additionally, the values of signals can be complex numbers. As such, a signal whose values include a complex number is called a complex signal. Accordingly, complex type propagation is the process of determining which blocks can and/or cannot accept as input or provide as output the complex type values associated with a signal.

Dimension type propagation is the process of determining which blocks can accept or output the signals connected to and from the signal in accordance with the dimension attributes of the signal. Blocks of the block diagram model 215, such as blocks 325a and 325b, may vary in the dimensionality of the signals they can accept or output during simulation. A one-dimensional signal may include a stream of one-dimensional arrays output at a frequency of one array per sample time. A two-dimensional signal may include a stream of two-dimensional arrays emitted at a frequency of one array per block sample time. A one dimension signal is generally referred to as a vectors and a two or more dimension signal as a matrix. A one-element array may be referred to as a scalar. A row vector is two-dimensional array that has one row, and a column vector is a two-dimensional array with one column. Some blocks can accept or output signals of any dimension. Others can accept or output only scalar or vector signals.

Other types of signal propagations are sample time and frame type propagation. Sample time is the time interval between samples to be applied as input to a port of a block or as output from a block. The graphical modeling environment 210 of Simulink® uses a process called sample time propagation to determine the sample times of blocks which inherit their sample times. Simulink® assigns an inherited sample time to a block based on the sample times of the blocks connected to its inputs. If all the inputs have the same sample time, the graphical modeling environment 210 assigns that sample time to the block. In some cases, if the inputs have different sample times, then a block without an explicit sample time may be assigned the sample time of the fastest input. A frame-based signal has a time interval between consecutive vector or matrix inputs to a block or outputs from a block. That is, an input frame rate indicates how many inputs are applied consecutively over a time period and in what time intervals. Similarly, an output frame rate indicates that a block will update an output signal at the output port at specified intervals over a specified time period. Accordingly, frame type propagation determines how a frame-type signal will be applied to the inputs and outputs it traverses based on block connectivity.

Although signal propagation is discussed above in terms of data type, dimension type, complex type, and sample and frame type propagation, other types of propagation may occur with respect to any other attribute associated with a sample. Generally, the process of propagation determines how the attributes of the signal will be applied as input and/or output to, from and between blocks from which the signal traverses in accordance with the block connectivity of the block diagram model 215. The propagation process may evaluate or compare the configuration of the signal attribute with the configuration and attributes of the block to determine the suitability of the block to process, or otherwise use the signal. During propagation of any signal, the propagation process may perform any type of integrity, consistency, or any other form of checking that is suitable for the type of attribute being propagated. Furthermore, it may perform any type of transformation, conversion, configuration or other processing that makes the propagation of the attribute suitable for execution or simulation. One ordinarily skilled in the art will recognize the different types of propagation and the different steps a propagation process may perform, and will further appreciate the propagation of the signal is to process the block diagram model into an executable form that may be suitable for simulation of the block diagram model 215.

Additionally, one ordinarily skilled in the art will recognize that dependencies between blocks and block diagram models may occur from the connectivity between blocks with respect to signals and signal propagations. As such, a model compilation process needs to check and take into consideration the traversal of the signal, the corresponding attributes, and the order of execution of blocks and updates to attributes in order to make a suitable executable form for simulation.

Figure 4:
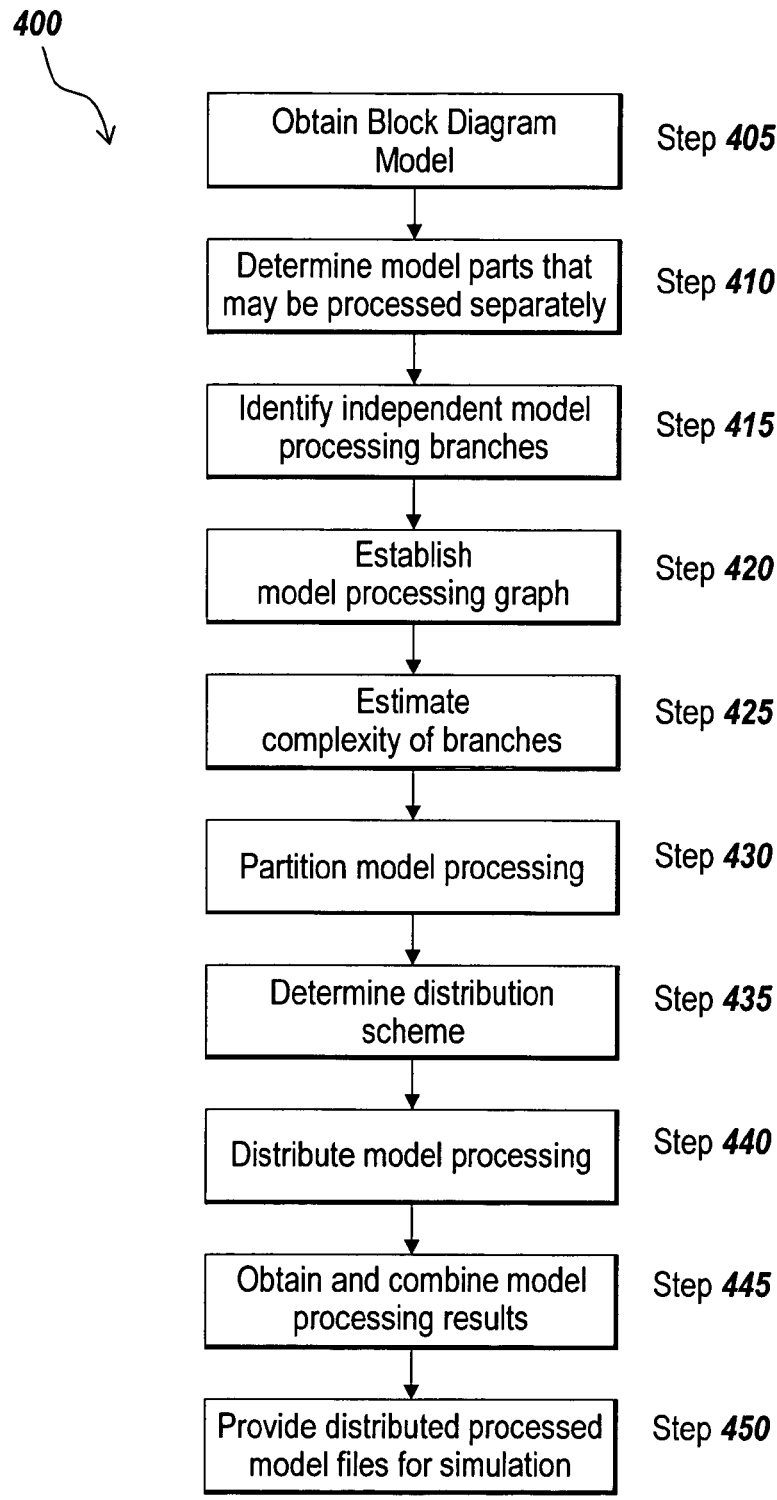
FIG. 4 is a flow diagram depicting steps performed in practicing an illustrative method of the present invention practiced with the embodiments shown in FIGS. 3A and 3B.

In one aspect, the present invention is directed towards the distributed processing of the model compilation of a block diagram model 215 to process the block diagram model 215 into an executable form. FIG. 4 depicts an illustrative method 400 of practicing an embodiment of the present invention. The illustrative method 400 can be practiced and will be discussed in conjunction with the exemplary system 200 shown in FIG. 2B using the block diagram model 215 example of FIGS. 3A and 3B. Furthermore, the illustrative method 400 will generally be discussed in terms of the graphical modeling environment 210 of Simulink®. As discussed above with respect to FIG. 2B, the system 200 may have a graphical modeling environment 210 with model compiler 220 and code building tool 240 on one computing device 102, and have other model compilers 220a-220n and/or code building tools 240a-240n deployed on multiple computing devices 102'-102''' on the network 204. The graphical modeling environment 220 communicates with and works with the distributed model compilers 220a-220n and/or code building tools 240a-240n to perform the distributed operations described herein.

In operation, the graphical modeling environment 210 of the system 200 obtains, receives, or otherwise provides a block diagram model 215 at step 405 of the illustrative method 400. The block diagram model 215 may be a hierarchical block diagram model 215 having references to one or more other unit or sub-system block diagram models 215. For example, the block diagram model 215 may represent the engine controller design as depicted in FIG. 3A. Furthermore, as depicted in FIG. 3B, the model block references 325a and 325b may reference block diagram models 215a and 215b as shown in FIG. 3B. In turn, the block diagram models 215a and 215*b* reference additional block diagram models, such as block diagram models "C", "D", and "E" 325*c*-325*d* as described in FIG. 3B. Although the illustrative method 400 is described using this block diagram model 215 as an example, one ordinarily skilled in the art will recognize that any block diagram model 215 may be used, and in other graphical modeling environments 215. In the graphical modeling environment 210, a request, command, or other action may be taken to initiate the simulation of the block diagram model 215. Any suitable mechanism may be used to trigger the model compilation of the block diagram model 215 into an executable form. For example, simulation may be initiated from a menu item selection or command button in the graphical modeling environment 210. This starts the model compilation processing of the block diagram model 215 to form an executable, either in interpretative mode or accelerated mode.

At step 410 of the illustrative method 400, the graphical modeling environment 210 determines which portions of the block diagram model 215 can be processed separately and/or concurrently. That is, it is determined which portion of the model compilation can be processed separately from another portion. Additionally, the separate portions may be processed concurrently by invoking executable instructions in different threads, programs, or processors to perform the model processing for each portion. This determination can be performed from a vertical distribution or horizontal distribution perspective. From the vertical distribution perspective, the block diagram model 215 and any unit models 215*a* and 215*b* are evaluated to determine what types of propagation may be performed separately from other portions of the block diagram model 215. For example, a block diagram model 215*a* may only be using complex signal attributes while block diagram model 215*n* does not use complex signal attributes. Therefore, in model compilation, only complex type signal propagation needs to be performed on block diagram model 215*a*. This step may be performed concurrently with another type of propagation. From the horizontal distribution perspective, any block diagram models 215*a*-215*b* incorporated in or referenced by a top level block diagram model 215 are evaluated to determine if they are disjoint from each other. One unit block diagram model 215*a* may be considered disjoint from another unit block diagram model 215*b* if there are no dependencies between the two with respect to signals, attributes, data, or otherwise. In these cases, the model compilation process, or a portion thereof, can be performed on the unit block diagram model 215*a* as if it were a stand-alone block diagram model 215. That is, all the steps of the model compilation process are performed sequentially on the block diagram model 215 as a whole until an executable form for the unit model 215*a*-215*b*, or a desired portion thereof, is created.

In one embodiment, the illustrative step 410 finds all the model reference blocks 325*a*-325*b*, and therefore, any unit models 215*a*-215*b*, in a block diagram model 215 by invoking a command available in the technical computing environment 120 of the present invention. For example, in the graphical modeling environment 210 of Simulink® there is a find_systems function that determines any subsystems, blocks, signals, ports or other elements of the block diagram model 215 and returns references to such elements, for example, in a matrix or array format. The find_systems function is an illustrative example and there may be other suitable means available from the graphical modeling environment 210 or technical computing environment 120 to determine the parts, elements, and relationships of the block diagram model 215, including unit block diagram models 215*a* and 215*b* and any signals 315*a*-315*n*. For example, the block diagram model 215 may be stored in a medium readable by the graphical modeling environment 210 and the graphical modeling environment may read, parse, translate, or otherwise obtain information from the block diagram model 215 to determine the parts of the block diagram model in accordance with the present invention.

Figure 5A:
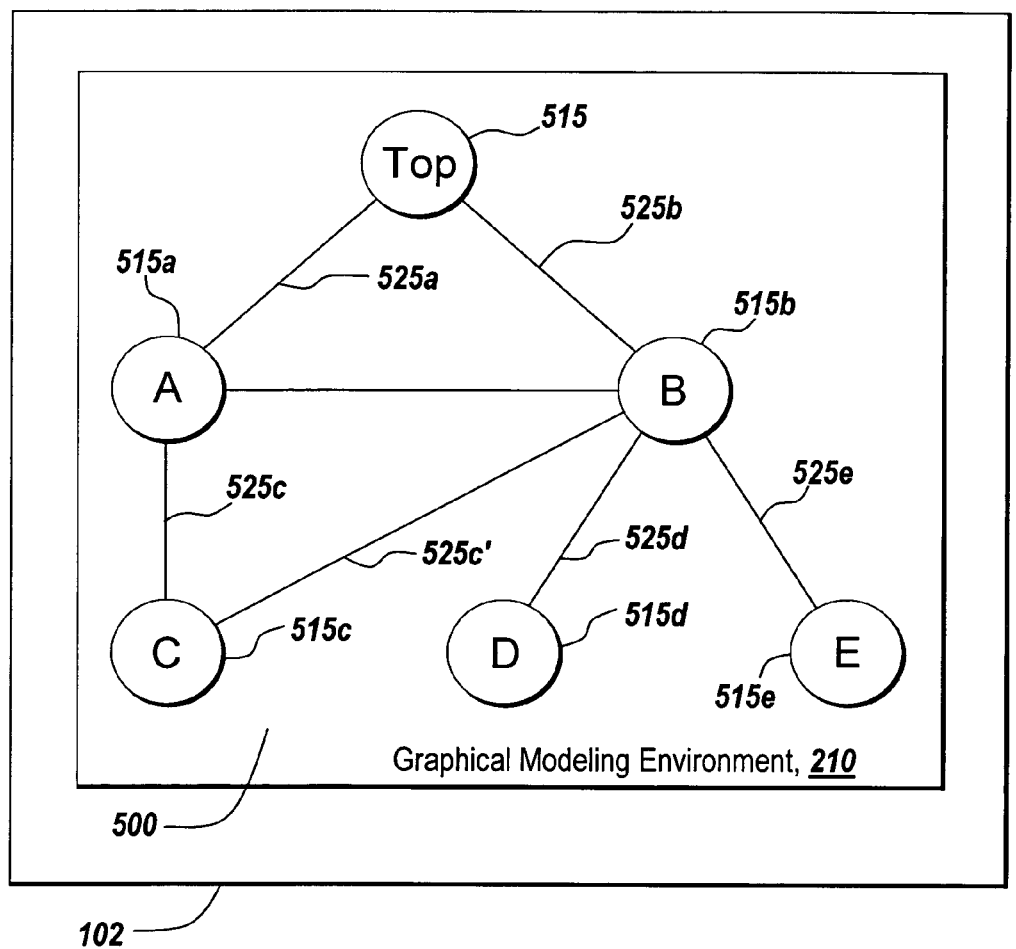
FIG. 5A is a block diagram of a graphical representation of identified model parts in accordance with an embodiment of the present invention.

In determining the parts of the block diagram model 215, step 410 may present the hierarchy in a representation such as the graphical tree view 500 shown in FIG. 5A. The graphical tree view 500 shows a tree view of the top level block diagram model 215 and any unit models. The top node 515 represents the top level block diagram model 215 and the other nodes 515*a*-515*e* represent unit block diagram models, or subsystems, referred directly or indirectly via the top level block diagram model 215. Each of the nodes 515-515*e* of the graphical tree view 500 has branches 525*a*-525*e* showing the model reference relationship in the hierarchy of the block diagram model 215. Although the parts of the block diagram model 215 from a hierarchical perspective are shown in a graphical tree view 500, other views of the block diagram model 215 may be used in accordance with the present invention. As one ordinarily skilled in the art will appreciate, other views may include an object-oriented implementation diagram, a finite state machine behavioral model, a scenario model, or any another graphical representation that is suitable for showing relationships, parts or portions of the block diagram model 215.

At step 415, the illustrative method 400 identifies the separate and/or concurrent paths of model processing from the graphical tree view 500, or any other suitable view as discussed above. In one embodiment of this step 415, the graphical user environment 210, or technical computing environment 120, uses a search algorithm to traverse the branches of the graphical tree view 500 to determine the separate and concurrent portions of model compilation for the entire block diagram model 215. In performing step 415, the algorithm may search any computer data related representative forms of the graphical tree view 500, such as a representation of the graphical tree view 500 that may be stored in any data, data structures, objects, in memory, storage or otherwise, or in any form accessible by, in or from the graphical modeling environment 210. Additionally, the algorithm may be written in the technical computing language of MATLAB® or in any other suitable language or form of executable instruction.

The problem of identifying these separate and concurrent paths may be considered a Non-deterministic Polynomial time (NP)-complete type problem. One ordinarily skilled in the art will recognize NP-complete type problems relate to the domain of complex computational theory and will appreciate the types of approaches to algorithmically solving these problems. Generally, algorithms for solving these types of problems require computing time that is exponential to the size of the problem. In one embodiment, a heuristic approach may be applied to aid in the identification of the separate and concurrent paths of model processing. A heuristic approach would apply some guidelines or rules of thumbs to the problem. For example, the algorithm may have rules on which types of signal propagation is processed in what order or will have a rule that indicates that the largest of the unit block diagram models 215*a*-215*b* are processed first. One ordinarily skilled in the art will appreciate that there is a wide range of heuristics that can be applied to determine the separate and concurrent model compilation paths of a block diagram model 215. Other types of algorithms such as probabilistic or approximation may be applied. One ordinarily skilled in the art will further appreciate that there are a wide range of algorithms that may be applied to determining the separate and concurrent paths for model compilation.

In one embodiment of a horizontal distribution approach to step 415, an algorithm would be performed on the graphical tree view 500, or any data representation thereof, to determine the different types of signal propagations that may occur separately and/or concurrently on portions of the block diagram model 215. For example, an order of propagation for each portion of the block diagram model 215 may be identified for each type of signal propagation. A portion may be identified at the granularity of a unit block diagram model 215a-215b, or at the level of a block of a block diagram model 215, or any other identifiable portion of the block diagram model 215. In another embodiment of the vertical distribution approach to step 415, an algorithm would be performed to determine the block diagram models 215-215b, or portions thereof that may be considered disjoint and which can be processed separately and/or concurrently. For example, each of the unit block diagram models 215a-215b may be identified for separate and concurrent model processing.

Figure 5B:
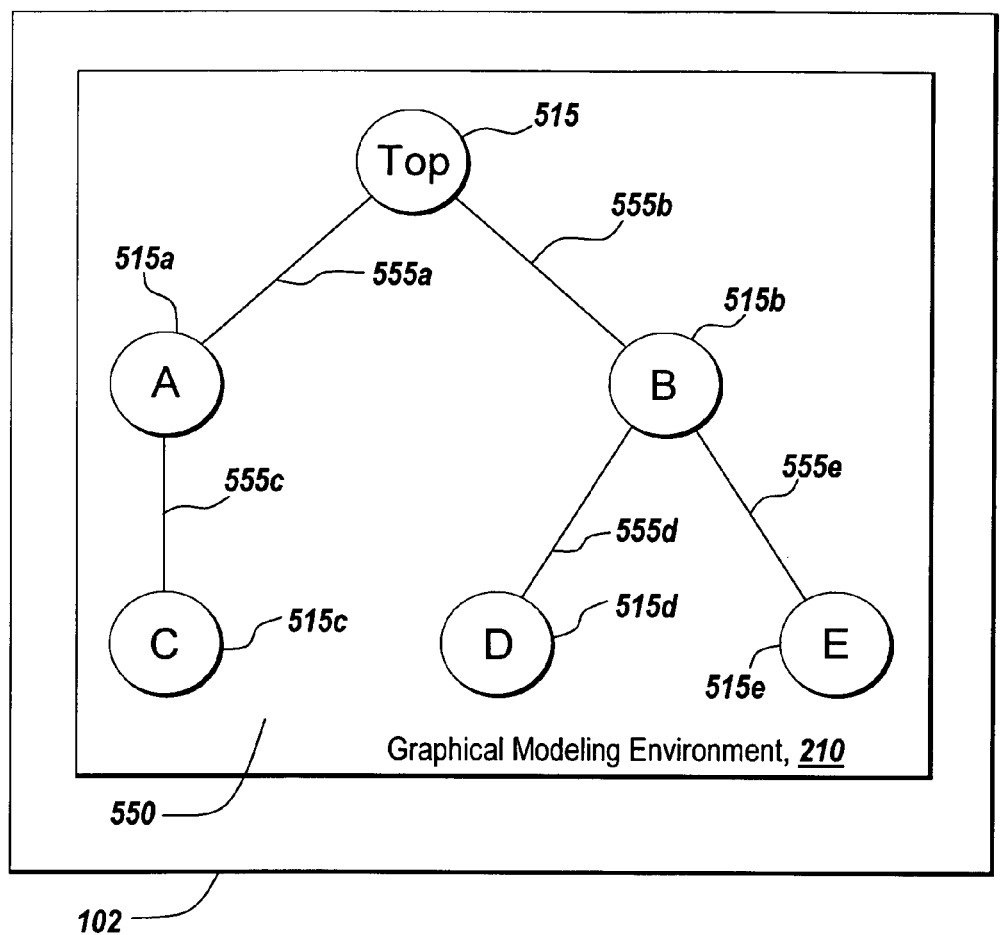
FIG. 5B is a block diagram of an illustrative example of a model processing graph for horizontal distribution in accordance with an embodiment of the present invention.

At step 420 of the illustrative method 400, the graphical modeling environment 210 establishes and shows a model processing graph representing the separate and/or concurrent paths of model compilation that have been identified in accordance with step 410. In FIG. 5B, a model processing graph 550 shows an example of a model processing graph established at step 420. The model processing graph 550 shows portions of the block diagram model 215 identified for horizontal distribution of model compilation. As described above, the horizontal approach searches for disjoint block diagram models in the hierarchy of the block diagram model 215 which may independently be processed for modeling compilation. By way of example, the horizontal distribution model processing graph 550 shows two branches 555a and 555b that may be performed separately and concurrently from each other. Branch 555a connects to the tree node 515a representing the block diagram model 215a referenced by model 215 in FIG. 3A. Branch 555b connects to the tree node 515b representing the block diagram model 215b referenced by model 215 in FIG. 3A. As such, by this example, block diagram models 215a and 215b may be processed separately. Additionally, branch 555c connects tree node 515a to tree node 515c, which represents a third block diagram model "C" reference by the model reference block 325c. The branch 555c indicates that the model processing of block diagram model "C" is dependent on and should occur after the model processing of block diagram model 215b. However, the model processing of block diagram model "C" can occur separately and concurrently from any of the model processing in the sub-tree of branch 555b, e.g., the model process of block diagram models "B", "D", and "E". Likewise, the branches of 555d and 555e leading from tree node 515b for block diagram model 215b identify that model processing for block diagram models "D" and "E" associated with tree nodes 515d and 515e can occur concurrently from each other, concurrently from the processing of block diagram models "A" and "C" but before the model processing of block diagram model "B."

Figure 5C:
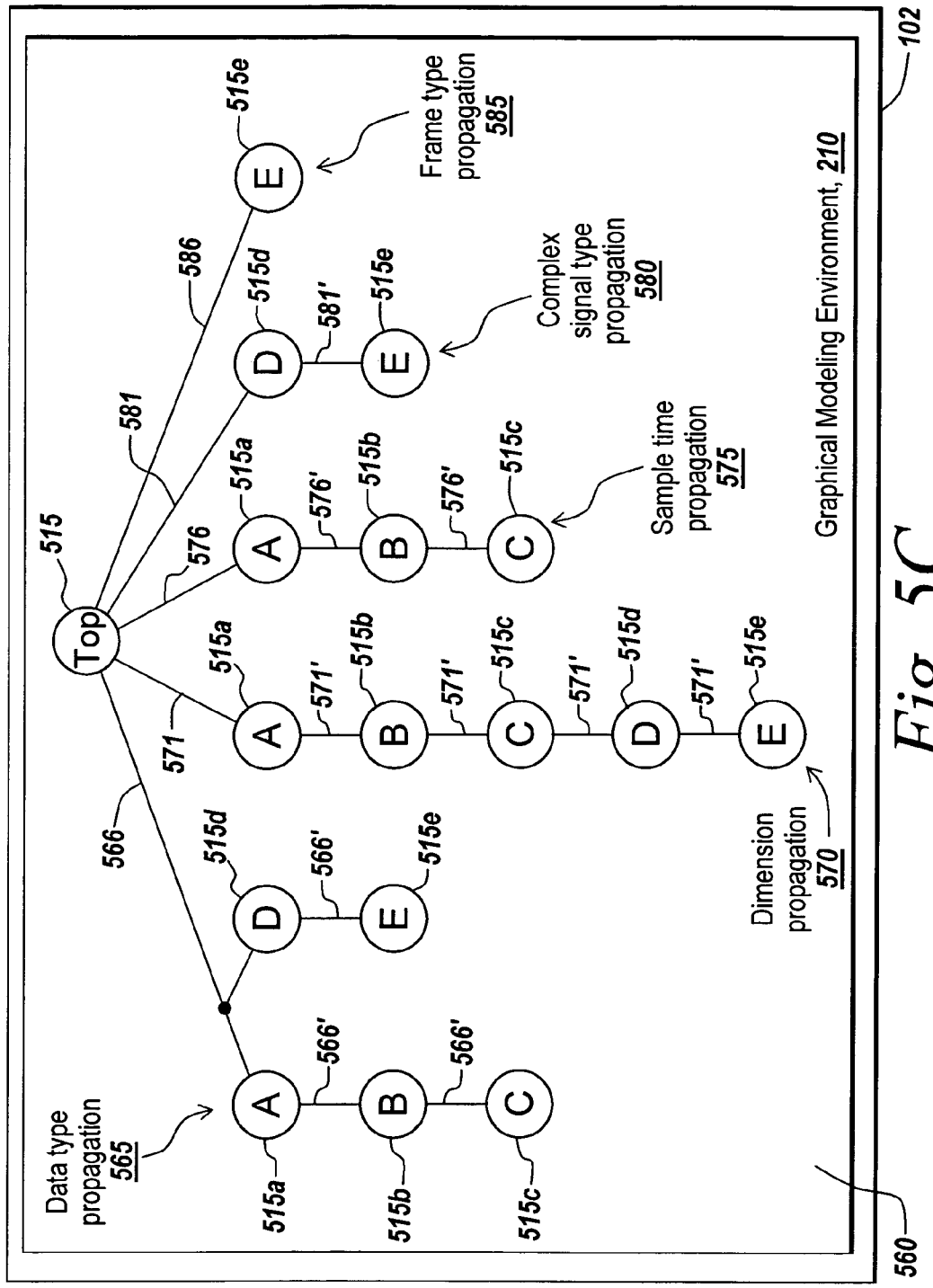
FIG. 5C is a block diagram of an illustrative example of a model processing graph for vertical distribution processing in accordance with an embodiment of the present invention.

FIG. 5C shows another example of a model processing graph 560 established at step 420 and displayed by the graphical modeling environment 210. In this case, the model processing graph 560 shows the independent paths of model processing for a vertical distribution approach. As described above, the vertical distribution approach searches the signal traversal through the blocks of the hierarchy of the block diagram model 215 to determine which types of propagation may be separately and/or concurrently processed for modeling compilation. By way of example, the vertical distribution model processing graph 560 shows five branches 566, 571, 576, 581 and 586 representing different types of signal propagation for model processing that may be performed separately and concurrently from each other. Branch 566 identifies the data type propagation tree 565, branch 571, the dimension propagation tree 507, branch 576, the sample time propagation tree 575, branch 581, the complex signal propagation tree, and branch 586 identifies the frame type propagation tree 585. Each of the propagation trees 565, 570, 575, 580 and 585 identify the paths of model processing that can occur for the respective signal propagation. For example, in the data type propagation tree 565, the step 415 of the illustrative method 400 has determined that data type signal propagation for block diagram models "A", "B" and "C" can be performed separately and concurrently from data type signal propagation for block diagram models "D" and "E". However, data type signal propagation for block diagram models "B" and "C" need to occur subsequent to each other and to block diagram model "A," while block diagram model "E" needs to be processed subsequent to block diagram model "D." In a similar manner, the other propagation trees 570, 575, 580, and 585 show which unit block diagram models can have signal propagations processed concurrently and/or subsequently to other unit block diagram models.

Although the vertical distribution model processing graph 560 shows five types of signal propagation in separate trees 560, 565, 570, 575, and 580, the vertical distribution model processing graph 560 may show any type of signal propagation and may combine two or more types into a single branch. For example, at step 415 of the illustrative method 400, the vertical distribution approach may determine which block diagram models may be able to perform both data type and dimensional signal propagation together but separately and concurrently from other block diagram models. Accordingly this would be reflected in the vertical distribution model processing graph 560.

Additionally, the horizontal and vertical approaches may be combined in any suitable manner at steps 415 to determine the separate and concurrent branches and displayed accordingly at step 420. In other embodiments, the tree nodes of any of the graphical models of FIGS. 5A-5C may represent blocks of block diagram models instead of block diagram models. As such, at step 415 it would be determined for either of the horizontal or vertical approaches which blocks may be compiled separately and/or concurrently from each other. One ordinarily skilled in the art will appreciate the steps at 415 and 450 can be performed for any granularity of identifiable portions of the block diagram model 215.

Furthermore, although the horizontal and vertical distribution model processing graphs of FIGS. 5B and 5C are shown in tree view form, any other type of graphical form can be used as discussed with regards to the tree view of FIG. 5A. Additionally, one skilled in the art will appreciate that any of the branches and tree nodes of the graphical models in FIGS. 5A-5C may take any form and further may be user selectable, movable, configurable or editable to change the respective models in a desired manner. In further embodiments, the graphical models of FIGS. 5A-5C may have additional identification and configuration information associated with the model such as with any branch or tree node. Any of the branches and tree nodes in FIGS. 5A-5C may be selectable, clickable or otherwise provide any type of information identifying any aspects of model processing of the block diagram model 215. For example, a tree node may include one or more details of the corresponding block diagram model, and the branches may include information on any model processing dependencies between nodes. Additionally, one may be able to drill down on a tree node to see the details of the underlying block diagram model and to get a tree view as if the unit block diagram model 215a-215b was the top view block diagram model 215. One ordinarily skilled in the art will appreciate how the graphical models of FIGS. 5A-5C may include and provide additional information associated with model processing related to the operations of the present invention described herein.

At step 425 of the illustrative method 400, the graphical modeling environment 210 evaluates the model processing graphs, or data representations thereof, to estimate computational and spatial complexity of the identified branches of the graphs, i.e., the paths of model processing identified in accordance with step 415. The graphical modeling environment 210 may use any suitable means to estimate the computational and spatial complexity of the separate and concurrent paths as identified in the examples of FIGS. 5A and 5B. For example, computational complexity may be estimated by considering the number of block diagram models, the number of blocks, the functionality, operations or algorithms of the blocks, or any data or attributes associated with or processed by any of the blocks. In other embodiments, the graphical modeling environment 210 may consider for computational complexity, the complexity or size of the code that needs to be generated to process the block diagram model 215 into an executable form. In further embodiments, the graphical modeling environment 210 may consider for computation complexity if there is any external interfacing performed by any of the blocks of the block diagram models.

With respect to spatial complexity, the graphical modeling environment 210, at illustrative step 425, may consider the number of trees, sub-trees, nodes and branches that can be performed separately and concurrently. Furthermore, the graphical modeling environment 210 may consider the relationships and dependencies between nodes and branches, such as those depicted in FIGS. 5A and 5B. For example, the number of recursive references to blocks or block diagram models may be considered. Additionally, the graphical modeling environment 210 may consider for spatial complexity the number and types of signal propagation and their respective extent of traversal through each of the blocks of the hierarchical block diagram model. For any computational and spatial complexity estimations, the graphical modeling information 210 may have business rules, guidelines, or other forms of information configured in or accessible in any form of medium by the graphical modeling environment 210 to assist in providing estimations. One ordinarily skilled in the art will appreciate there is a wide range of suitable means for estimating complexities to the identified model processing paths in accordance with the present invention.

At step 430, the graphical modeling environment 210 partitions the model compilation into processing tasks based on the model processing paths identified at step 415 and the estimated complexities determined at step 425. Examples of model processing tasks to be performed by the model compiler 220 and/or the code building tool 240 may include any tasks or sub-tasks related to 1) propagating any signals, 2) generating code for any of the blocks, signals or other elements of the block diagram model 215, 3) setting up any run-time environment, overhead, global or general data structures, memory allocation, etc., 4) setting up any debug environments to debug the executable form of the block diagram model 215, 5) compiling any code, and 6) loading any code to provide the executable form of the block diagram model 215. These processing tasks will depend on and vary according to if the executable form is being generated for an interpretative or accelerated mode. In interpretative mode, the model compiler 220 may be used to process the block diagram model 215, and in accelerated mode, the code building tool 240 may be used to generate code for the block diagram model 215. As such, different tools for model processing may have different tasks and sub-tasks. For example, in interpretive mode, the code may not need to be compiled as illustrated in the above task list. One ordinarily skilled in the art will recognize that there may be other types of tasks and subtasks for compiling a model under a graphical modeling environment 210 of Simulink®, and these tasks may vary across different types of graphical modeling environments 210. Furthermore, one ordinarily skilled in the art will appreciate that the tasks may depend on the types of model compilers 220 and code building tools 240 used for providing an executable form of the block diagram model 215.

At illustrative step 430, the graphical modeling environment 210 may use any suitable scheme for partitioning the model processing of the block diagram model 215. For example, the graphical modeling environment 210 may partition the model processing tasks according to a ranking order of complexities assigned to model processing paths. In these cases, the most complex signal propagation and code generation tasks may occur first. In another example, the graphical modeling environment 210 may partition the model processing by which paths are the most independent from other paths, or in other words, has the least dependencies on the model processing of other portions of the block diagram model 215. Or in another cases, the graphical modeling environment 210 may first process the path or portion of the block diagram model 215 that has the highest number of other paths or portions of the block diagram model 215 depending on it. In a further example, it may partition that tasks based on a ranking of the computation burden, length of processing time or other resource considerations. As such, the graphical modeling environment 210 may partition the model processing tasks such that the tasks taking the longest time to process will be worked on first. One ordinarily skilled in the art will recognize and appreciate the multitude of ways that tasks of model processing can be subdivided for either the interpretative or accelerated modes.

At step 435 of the illustrative method 430, the graphical modeling environment 210 determines a distribution scheme. The graphical modeling environment 210 determines the computing devices 102 available on the network 204 of system 200 in FIG. 2B to process the tasks for processing the block diagram model 215 into an executable form. For example, the graphical modeling environment 210 on computing device 102 may determine the other model compilers 220a-220n and/or code building tools 240a-240n that are available on the network 204 to perform model processing tasks. As discussed above with regards to system 200 of FIG. 2B, the model compilers 220a-220n and/or code building tools 240a-240n may each be running on different computing devices with different operating systems and processors. The graphical modeling environment 210 may determine any of the capabilities of any of the available computing devices 102. For example, the number, type, speed and other operational characteristics of the processors of the computing device 102 may be considered. In another example, the type, bandwidth availability, latency, and any other operational characteristics of the computing devices 102 network connectivity may be considered. Additionally, the resource and user load of any of the computing devices 102 may be considered by the graphical modeling environment 210 in determining how to distribute the model processing tasks identified at illustrative step 430. The graphical modeling environment 210 may perform any type of algorithm to determine and/or optimize the distribution scheme. Additionally, the graphical modeling environment 210 may provide any type of configuration mechanism for a user to identify and configure a custom distribution scheme to have the processing tasks distributed in a desired manner. One ordinarily skilled in the art will appreciate there are wide range of factors and characteristics that can be considered for determining a way to distribute processing tasks to one or more computing devices in an optimized or desired manner.

At step 440 of the illustrative method, the graphical modeling environment 210 distributes the tasks to one or more computing devices 102 in the illustrative system 200 in accordance with the distribution scheme determined at step 435. The distribution may depend on whether the model compilation is for an interpretative or accelerated executable form of the block diagram model 215. In the case of interpretative mode, the model compiler 220 on computing device 102 and model compilers 220a-220n on computing devices 102'-102''' in the illustrative system 200 of FIG. 2B may perform one or more of the distributed model processing tasks. Likewise, in the case of accelerated mode, the code building tool 240 on computing device 102 and code building tool 240a-240n on computing devices 102'-102''' may perform one or more of the distributed tasks. Either of the technical computing environment 120, the graphical modeling environment 210, the model compiler 220, or the code building tool 190 on computing device 102 may have a distribution mechanism to distribute the processing tasks to corresponding model compilers 220a-220n or code building tools 240a-240n identified by the determination of the distribution scheme at step 435.

The corresponding model compilers 220a-220n and code building tools 240a-240n may interface and communicate over the network 204 using any suitable means or mechanisms in order to receive and process any model processing tasks communicated from any other model compiler 220-220n or code building tool 240-240n, or from the graphical modeling environment 210. The model compilers 220-220n or code building tools 240-240n receiving model processing tasks will process the tasks in a manner suitable to provide a portion of the executable form of the block diagram model 215. Furthermore, the model compilers 220-220n or code building tools 240-240n will perform the model processing tasks in a manner so that the results from processing of the tasks may be combined, aggregated, or otherwise used to provide an executable form for executing the block diagram model 215 in the desired manner.

Although the illustrative system 200 of FIG. 2B is shown with one model compiler 220 and code building tool 240 per computing device 102, there may be multiple model compilers 220-220n and code building tools 240-240n running on each computing device 102. Additionally, there may be multiple model compilers 220-220n and code building tools 240-240n running on a plurality of computing devices 102 on the network 204. Furthermore, each of the computing devices 102 running either a model compiler 220-220n and/or code building tool 240-240n may have a different operating system and processor architecture than any other computing device 102 running either a model compiler 220-220n and/or code building tool 240-240n. On each computing device 102, the model processing task may be executed by the respective model compiler 220 or code building tool 240 as a task, service, process, thread, program or any other form of executable instructions. In one embodiment, there may be one or more model processing tasks, model compilers 220-220n or code building tools 240-240n executing on each processor of a multi-processor computing device 102 or on the same processor of either a single or multiple processor computing device 102. One ordinarily skilled in the art will appreciate how the model compilers 220-220n and code building tools 240-240n may process tasks concurrently and separately on the same computing device and over the network 204 on multiple computing devices 102.

At step 445 of the illustrative method, the graphical modeling environment 210 obtains the results from the distributed tasks to process the block diagram model 215 into an executable form. The graphical modeling environment 210 may determine by any suitable means that the distributed tasks for model processing have all been completed, performed, or otherwise executed. In one embodiment, each of the model compilers 220-220n or code building tools 240-240n performing the model processing tasks may communicate a result, status or other communication associated with the task to the graphical modeling environment 210. For example, such communication may identify the success or error status of processing the task. As there are multiple model processing tasks, each task makes up a portion of the overall model compilation to form an executable for the block diagram model 215. Therefore, the results from each of the tasks each may make up a portion of the desired executable form. The graphical modeling environment 210 obtains each result from each distributed task and combines them in a suitable manner in order to facilitate providing the final executable form of the block diagram model 215, which will be discussed below.

In one exemplary embodiment, the results of each task performed by one of the model compilers 220-220n or code building tools 240-240n may be placed in a directory accessible over the network 204. The location and name of the directory may be configurable in the graphical modeling environment 210 and provided by the graphical modeling environment 210 with the distributed task so that the model compiler 220-220n or code building tool 240-240n knows of the directory. The directory may further follow a naming convention so that results may be placed in the directory or in sub-directories in a logical fashion. For example, for a horizontal distribution, the results of model processing for each unit block diagram model 215a-215b may be placed in a sub-directory name that identifies the name of the unit block diagram model 214a-215b. Further, in the example of the accelerated mode of compilation, a compiled shared library having executable instructions representative of the functionality of the unit block diagram model 215a-215 may be placed in the sub-directory named for the unit block diagram model 215a-215b.

In this manner, all the results of the model processing tasks may be collected under a root or top level directory, with sub-directories holding the results from the distributed model processing tasks. One ordinarily skilled in the art will recognize the various alternatives to obtaining the results from distributed processing using a directory mechanism. For example, each model compiler 220-220n or code building tool 240-240n may place the results of processing tasks into a directory on the computing device 102 from which they execute. Although generally discussed as using a directory structure to obtain and collect the results from processing tasks, any other suitable mechanism, such as a database, or a message-passing and application programming interface may be used. In another embodiment, for example for the accelerated mode, the code generated from the code building tools 240-240n, such as source code, object code or libraries, may be placed in directory for building one or more programs to form an executable. Then, one of the code building tools 240 may perform a build of one or more of the programs, such as compiling and/or linking the code to form an executable.

One ordinarily skilled in the art will further appreciate that there are a multitude of alternative ways to obtain and collect the results from the processing the distributed model compilation tasks.

In an exemplary embodiment of the present invention, steps 435, 440 and 445 may be performed in accordance with the illustrative embodiment of system 200 of FIG. 2C. That is, the steps of determining a distribution scheme, distributing model processing tasks, and obtaining model processing tasks results can be performed using the distributed computing toolbox 250, job manager 265, and workers 270a-270n as described in conjunction with system 200 of FIG. 2C. In this embodiment, at step 435, the distribution scheme would be determined by the job manager 265 which coordinates and manages the distribution of tasks to one or more workers 270a-270n on the network 204. In one embodiment, the job manager 265 may use any of the methods of determining a distribution scheme as described above with respect to step 435. As such, the job manager 265 may have any configurable, loadable or built-in functionality to determine how to distribute tasks to workers 270a-270n.

The graphical modeling environment 210 or technical computing environment 120 may find a job manager 265 from one or more job managers 265 that may be available on the network 204. A function or application programming interface (API) call, such as findresource, of the distributed computing toolbox 250 of MATLAB® may be used to find a job manager 265 by name, type, properties, host name, internet protocol address or by a uniform resource locator (URL). For example, the following set of MATLAB® executable instructions may be used to find all the job managers 265 available on the network 204:

all_managers=findResource('jobmanager')

Then, the properties of each job manager 265 can be used to identify which job manager 265 to use:

for i=1:length(all_managers)
  get(all_managers(i))
end

Then a job manager object can be created for the job manager 265 selected for use by executing the following illustrative instruction:

jm=all_managers(3)

The job manager object will be used in creating jobs and tasks as described below. One ordinarily skilled in the art will appreciate that any other suitable means may be used to determine or find a job manager 265, or otherwise obtain the services of a job manager 265.

In this exemplary embodiment, at illustrative step 440, jobs and tasks would be created via the distributed computing toolbox 250 in either the graphical modeling environment 210 or technical computing environment 120 to distribute the model processing tasks determined at step 430 of the illustrative method 400. One or more jobs can be created to hold the model processing tasks necessary to complete the operation of providing or generating an executable form of the block diagram model 215. In one embodiment, one job can be created to comprise all the tasks of model processing, and in another embodiment, multiple jobs may each comprise a subset of the tasks needed for model processing. Via the distributed computing toolbox 250, a job can be created by calling the function or API of createjob. For example, the following MATLAB® executable instruction creates a job named "job1" on the job manager 265 named "jm":

job1=createJob(jm)

Once the job is created, tasks can be created and associated with the job. For example, the following executable instructions creates a new task in the job "jm":

task1=createTask(jm, functionhandle, numoutputargs, inputargs)

The functionhandle for the task can point to or otherwise reference the name of a function for handling one or more of the model processing tasks determined at step 430 of illustrative method 400. The numoutputargs and inputargs of the createTask function can be used for passing input parameters and receiving output parameters from the function represented by the functionhandle in executing the task. At illustrative step 440, one or more jobs can be created using the createJob function and each of the model processing tasks determined at step 430 can be added to any of the jobs. Once the desired tasks are created and associated with one or more jobs, the jobs can be submitted for distribution to workers 270a-270n by the job manager 265.

To submit a job for distribution and execution, the one or more jobs are submitted to a job manager 265 by calling the following illustrative MATLAB® executable instruction for each of the jobs:

submit(job1)

As a result of the submission, the job manager 265 distributes the tasks of job1 to registered workers 270a-270n for execution. The job manager 265 distributes the tasks, which comprise model processing tasks, to workers 270a-270n by any suitable distribution scheme. As each worker 270a-270n completes performing a task received by the job manager 265, the properties of the task object are updated to contain results associated with the model processing task.

At illustrative step 445 of this embodiment, the results of the distributed processing of tasks are obtained. When all the tasks of the one or more jobs representing the operation of the model processing of the block diagram model 215 are completed, the job is completed and results can be obtained from one or more task objects of each job. For example, the following MATLAB® executable instructions shows how results from a job may be obtained in one embodiment:

results=getAllOutputArguments(job1);

In this example, the getAllOutPutArguments function returns a M-by-N cell array of job results. One ordinarily skilled in the art will recognize there are other functions and methods for obtaining task results, such as obtaining the results directly from each of the task objects in the job.

In one embodiment, the results from each of the tasks comprise a name, a pointer, or reference to one or more files generated by a worker 270a-270n in performing a model processing task. The files may be generated, provided and/or stored on the computing device 102'-102''' of the worker 270a-270n or any other accessible location or computing device 102 on the network 204. In another embodiment, the task results are zipped, or otherwise compressed into a set of one or more files produced by performing the model processing tasks. For example, the worker 270a-270n may have processed a task to generate ANSI-C code for a portion of the block diagram model 215, such as one or more blocks of the block diagram model 215. As such, the worker 270a-270n in conjunction with the code building tool 240a-240n may have generated one or more source code files representative of the functionality of the blocks of the block diagram model 215.

As part of the same task or as another task in the same job or another job, the one or more source code files may be zipped by the worker 270a-270n using any suitable compression utility.

The graphical modeling environment 210 via the distributed computing toolbox 250 can obtain the results from the job manager 265 and combine the results of the model processing tasks. In one embodiment, each worker 270a-270n provides one or more files, either zipped or uncompressed, and the graphical modeling environment 210 obtains all the sets of files. In another embodiment, the results are obtained from the job manager 265 in one zipped file comprising all the files generated from all the distributed tasks. The graphical modeling environment 210 may combine the results by storing, arranging, or otherwise placing the files resulting from the tasks in one or more directories either on the computing device 102 of the graphical modeling environment 210 or any other computing device accessible on the network 204.

In one embodiment, each of the workers 270a-270n performing model processing tasks at illustrative steps 440 may each be on a different hardware and/or operating system platform from any other worker 270a-270n, job manager 265, or the graphical modeling environment 210 and distributed computing toolbox 250. In accelerated mode of model processing, each of the workers 270a-270n may be assigned one or more model processing tasks to generate source code for a portion of the block diagram model 215. The workers 270a-270n may work in conjunction with the code building tools 240-240n to generate source code files, such as ANSI-C source code files, which generally are portable across different operating systems and/or hardware platforms. Since the files are ANSI-C compliant or following any other suitable cross-platform standards, the source code files obtained and combined by the graphical modeling environment 210 at illustrative step 445 can then be compiled on the same computing device 102 as the graphical modeling environment 210 or compiled together on any other platform.

In another embodiment of the interpretative mode of model processing, each of the workers 270a-270n may work in conjunction with the model compiler 220-220n to generate interpretative code in files, such as in the MATLAB® programming language, or in any other suitable form for a portion of the block diagram model 215. Although the interpretative code may have been generated on different operating systems or hardware platforms, the interpretative code is portable to other graphical modeling environments 210 which are capable of and configured to execute the MATLAB® programming language. In this manner, the graphical modeling environment 210 can obtain and combine interpretative code files generated by any worker 270a-270n to provide an executable form of the block diagram model 215 in the graphical modeling environment 210. In summary, either in accelerated mode or interpretative mode, the graphical modeling environment 210 can obtain files resulting from tasks distributed to workers 270a-270n on heterogeneous platforms and combine the results to provide an executable form of the block diagram model 215.

At step 450 of the illustrative method 400, the graphical modeling environment 210 is capable of loading the results obtained and combined from step 445 in such as manner as to provide a final executable form of the block diagram model 215. The interpretative or accelerated model compilation process may have been initiated by a request to simulate or execute the block diagram model 215 in the graphical modeling environment 210. Therefore, after the graphical modeling environment 210 performs steps 405 to 445 of the illustrative method 400, the graphical modeling environment 210 may further respond to the simulation or execution request by providing the executable form of the block diagram model 215. In order to provide the executable form of the block diagram model 215, the graphical modeling environment 210 may load the results from the distributed model processing tasks. In one exemplary embodiment, the graphical modeling environment 210 may load in or link to various forms of executable instructions, such as shared libraries or files having interpretive programming language statements, that are stored in the directory structure as discussed above in conjunction with step 245. In one embodiment of the interpretative mode of simulation, the graphical modeling environment 210 may read and load files having interpreted executable instructions into the execution engine 225 for execution. The graphical modeling environment 210 may load all the files on start of the simulation or on an on going and as needed basis. In another embodiment of simulation in accelerated mode, the graphical modeling environment 210 may call a function, application programming interface, or link to and load a library, or use any other suitable interface to invoke execution of the executable instructions generated in a compiled form by the code building tools 240-240n.

In view of the structure, functions and operations of the graphical modeling environment, model compiler, code building tool and other components of the present invention as described herein, the present invention provides systems and methods for partitioning the model compilation of a block diagram model into separate or concurrent model processing tasks that can be executed independently. This allows portions of the model compilation process to occur concurrently on the same or multiple computing devices rather than subsequently. Furthermore, the separate model processing tasks may be distributed to multiple computing devices or processors in order to leverage additional computing resources in performing model compilation. This distributed approach facilitates the reduction in model compilation time.

Many alterations and modifications may be made by those having ordinary skill in the art without departing from the spirit and scope of the invention. Therefore, it must be expressly understood that the illustrated embodiments have been shown only for the purposes of example and should not be taken as limiting the invention, which is defined by the following claims. These claims are to be read as including what they set forth literally and also those equivalent elements which are insubstantially different, even though not identical in other respects to what is shown and described in the above illustrations.

What is claimed is:

1. In a computer system, a computer-implemented method for partitioning a processing of a graphical model, the method comprising:

generating, using the computer system, a graph comprising a plurality of nodes, at least one node of the graph being depended upon by two or more nodes of the graph, the graph identifying one or more sections of the graphical model for which to perform one or more portions of the processing, the graph representing one or more separate paths of model compilation and one or more concurrent paths of model compilation;

identifying, using the computer system, a first section of the graphical model, from the graph, for which to perform a first portion of the processing;

identifying, using the computer system, a second section of the graphical model, from the graph, that can be concurrently processed with the identified first section and for which to perform a second portion of the processing;

processing concurrently, using the computer system, the first section of the graphical model with the second section of the graphical model, the concurrent processing including:
generating, as part of the first portion of processing, code for the identified first section, and
generating, as part of the second portion of processing, code for the identified second section; and
storing, using the computer system, the generated code for the identified first section and the generated code for the identified second section in at least one of a storage device and a memory.

2. The method of claim 1, wherein one of the first section or the second section identifies a second graphical model associated with the graphical model.

3. The method of claim 2, wherein one of the first portion of the processing and the second portion of the processing comprises processing of the second graphical model.

4. The method of claim 1, wherein one of the first portion of the processing and the second portion of the processing comprises a propagation of a signal identified in the graphical model.

5. The method of claim 4, wherein the propagation of the signal comprises propagating an attribute of the signal of one or more of the following types: a data type, a dimension, a sample time, a frame type, or a complex number type.

6. The method of claim 1, further comprising:
displaying, using the computer system, a graphical representation of one or more portions of processing that are performed concurrently on one or more sections of the graphical model.

7. The method of claim 1, further comprising:
combining, using the computer system, a result of the first portion of the processing and a result of the second portion of the processing to generate code for the graphical model.

8. The method of claim 1, wherein the graphical model is a block diagram model.

9. The method of claim 1, wherein a portion of the graphical model includes one of a non-graphical language or a textual language.

10. The method of claim 1, wherein the at least one node is processed only once.

11. The method of claim 1, further comprising:
compiling at least a portion of the graphical model or interpreting at least a portion of the graphical model.

12. In a computer system, a computer-implemented method to distribute tasks for partitioning a processing of a graphical model, the processing including a first portion and a second portion, the method comprising:
identifying, using the computer system, a first task, associated with the first portion of the processing, to distribute for processing;
identifying, using the computer system, a second task, associated with the second portion of the processing, to distribute for processing, the first task or the second task including propagating an attribute of a signal identified in the graphical model;
processing concurrently, using the computer system, the identified first task and the identified second task, the concurrent processing including generating one or more executable forms of the graphical model; and
storing, using the computer system, the one or more executable forms in a storage device or a memory.

13. The method of claim 12, further comprising:
identifying one or more computing devices suitable to process at least one of the first task and the second task.

14. The method of claim 12, further comprising:
distributing for processing one of the first task and the second task to at least one of a first computing device and a second computing device.

15. The method of claim 14, wherein the first computing device executes an operating system that is different than an operating system executed by the second computing device.

16. The method of claim 12, further comprising:
processing, using the computer system, at least a portion of the first task concurrently with a processing of a portion of the second task.

17. The method of claim 12, further comprising:
combining, using the computer system, a result of processing the first task with a result of processing the second task, the combined results providing at least a portion of the executable form of the graphical model.

18. The method of claim 12, wherein the attribute represents one or more of the following: a data type, a dimension, a sample time, a frame type, and a complex number.

19. The method of claim 12, wherein at least one of the executable forms includes: executable instructions, code, or a shared library.

20. The method of claim 12, further comprising:
compiling at least a portion of the graphical model or interpreting at least a portion of the graphical model.

21. In a computer system, a computer-implemented method for partitioning a processing of a first executable entity, the processing including a first portion and a second portion, the method comprising:
identifying, using the computer system, a first task to distribute for processing, the first task being associated with the first portion of the processing;
identifying, using the computer system, a second task to distribute for processing, the second task being associated with the second portion of the processing, the first task or the second task including propagating an attribute of a signal identified in the first executable entity, the first portion of the processing or the second portion of the processing including a reference to a second executable entity;
processing concurrently, using the computer system, the identified first task and the identified second task, the concurrent processing including generating one or more executable forms of the first executable entity and the second executable entity; and
storing, using the computer system, the one or more executable forms in a storage device or a memory.

22. The method of claim 21, wherein at least a portion of the processing of the second executable entity is performed by one of the first task and the second task.

23. The method of claim 21, wherein one of the first executable entity and the second executable entity comprises a block diagram model.

24. The method of claim 21, wherein a portion of the first executable entity or the second executable entity comprises one of a non-graphical language and a textual language.

25. The system of claim 24, further comprising a graphical user interface representing portions of processing that can be processed concurrently on sections of the graphical model.

26. The method of claim 21, wherein at least one of the executable forms includes: executable instructions, code, or a shared library.

27. The method of claim 21, wherein processing concurrently the identified first task and the identified second task further comprises compiling the first executable entity or interpreting the first executable entity.

28. A system for partitioning a processing of a graphical model, the processing including a first portion and a second portion, the system comprising:
- a memory; and
- a processor configured to:
  - generate a graph comprising a plurality of nodes, at least one node of the graph being depended upon by two or more nodes of the graph, the graph identifying one or more sections of the graphical model for which to perform one or more portions of the processing, the graph representing one or more separate paths of model compilation and one or more concurrent paths of model compilation,
  - identify a first section of the graphical model, from the graph, for which to perform a first portion of the processing,
- identify a second section of the graphical model, from the graph, that can be concurrently processed with the identified first section and for which to perform a second portion of the processing,
  - concurrently process the first section of the graphical model with the second section of the graphical model, the concurrent processing including:
    - generate, as part of the first portion of processing, code for the identified first section, and
    - generate, as part of the second portion of processing, code for the identified second section, and
  - store the generated code for the identified first section and the generated code for the identified second section in at least one of a storage device and the memory.

29. The system of claim 28, further comprising one or more model compilers for processing at least a section of the graphical model by performing one or more of the following signal type propagations: data type propagation, dimension propagation, sample time propagation, frame type propagation or complex number type propagation.

30. The system of claim 28, further comprising one of a model compiler and a code generator to provide code for the graphical model.

31. The system of claim 30, wherein one of the model compiler and the code generator executes on a first computing device or a second computing device.

32. The system of claim 31, wherein the first computing device executes an operating system that is different than an operating system executed by the second computing device.

33. The system of claim 28, wherein one of the first section and the second section of the graphical model comprises a reference to a second graphical model.

34. The system of claim 33, wherein the processor is further configured to:
process the second graphical model.

35. The system of claim 28, wherein the processor is further configured to:
generate code for the graphical model by combining at least a portion of results from processing the first section of the graphical model and at least a portion of results from processing the second section of the graphical model.

36. The system of claim 28, wherein the graphical model comprises a block diagram model.

37. The system of claim 28, wherein a portion of the graphical model comprises one of a non-graphical language and a textual language.

38. The system of claim 26, further comprising:
a storage device, the generated code for the identified first section and the generated code for the identified second section being stored at least in one of the memory and the storage device.

39. The system of claim 28, wherein the at least one node is processed only once.

40. The system of claim 28, wherein the processor is further configured to:
compile at least a portion of the graphical model or interpret at least a portion of the graphical model.

41. A system for partitioning a processing of a graphical model, the processing including a first portion and a second portion, the system comprising:
- a memory;
- a processor configured to:
  - identify a first task, associated with the first portion of the processing, to distribute for processing,
  - identify a second task, associated with the second portion of the processing, to distribute for processing, the first task or the second task including propagating an attribute of a signal identified in the graphical model,
  - process the identified first task and the identified second task concurrently, the processing including generating one or more executable forms of the graphical model, and
  - store the one or more executable forms in the memory.

42. The system of claim 41, wherein the processor is further configured to:
identify one or more computing devices suitable to process at least one of the first task and the second task.

43. The system of claim 41, wherein the processor is further configured to:
generate a result associated with providing a portion of the one or more executable forms of the graphical model.

44. The system of claim 43, wherein the result includes one or more of the following: executable instructions, code, or a shared library.

45. The system of claim 43, wherein the system distributes the first task or the second task to at least one of a model compiler and a code generator.

46. The system of claim 41, wherein at least a portion of the first task is processed concurrently with a processing of a portion of the second task.

47. The system of claim 41, wherein the modeling environment combines a result of processing the first task with a result of processing the second task, the combined results providing at least a portion of an executable form of the graphical model.

48. The system of claim 41, wherein the signal attribute represents one or more of the following: a data type, a dimension, a sample time, a frame type, and a complex number.

49. The system of claim 40, further comprising:
a storage device, the executable forms being stored at least in one of the memory and the storage device.

50. The system of claim 41, wherein the processor is further configured to:
compile at least a portion of the graphical model or interpret at least a portion of the graphical model.

51. A system for distributing tasks for partitioning a processing of a first executable entity, the processing including a first portion and a second portion, the system comprising:
- a memory; and
- a processor configured to:
  - identify a first task, associated with the first portion of the processing, to distribute for processing, identify a second task, associated with the second portion of the processing, to distribute for processing, the first task or the second task including propagating an attribute of a signal identified in the first executable entity, the first portion or the second portion of the processing including a reference to a second executable entity, process concurrently the identified first task and the identified second task, the concurrent processing including generating one or more executable forms of the first executable entity and the second executable entity, and store the one or more executable forms in the memory.

52. The system of claim 51, wherein at least a portion of the processing of the second executable entity is performed by one of the first task and the second task.

53. The system of claim 51, wherein one of the first executable entity and the second executable entity comprises a block diagram model.

54. The system of claim 51, wherein a portion of one of the first executable entity and the second executable entity comprises one of a non-graphical language and a textual language.

55. The system of claim 51, further comprising:
a storage device, the executable forms being stored at least in one of the memory and the storage device.

56. The system of claim 51, wherein the processor is further configured to:
compile the first executable entity or interpret the first executable entity.

57. A computer readable medium storing computer executable instructions which when executed by a computer perform a partitioning of a processing of a graphical model, the medium comprising one or more instructions for:
generating a graph comprising a plurality of nodes, at least one node of the graph being depended upon by two or more nodes of the graph, the graph identifying one or more sections of the graphical model for which to perform one or more portions of the processing, the graph representing one or more separate paths of model compilation and one or more concurrent paths of model compilation;
identifying a first section of the graphical model, from the graph, for which to perform a first portion of the processing;
identifying a second section of the graphical model, from the graph, that can be concurrently processed with the identified first section and for which to perform a second portion of the processing;
processing concurrently the first section of the graphical model with the second section of the graphical model, the concurrent processing including:
generating, as part of the first portion of processing, code for the identified first section, and
generating, as part of the second portion of processing, code for the identified second section; and
storing the generated code for the identified first section and the generated code for the identified second section in at least one of a storage device and a memory.

58. The medium of claim 57, wherein one of the first section or the second section identifies a second graphical model associated with the graphical model.

59. The medium of claim 58, wherein one of the first portion of the processing and the second portion of the processing comprises processing of the second graphical model.

60. The medium of claim 57, wherein one of the first portion of the processing and the second portion of the processing comprises a propagation of a signal identified in the graphical model.

61. The medium of claim 60, wherein the propagation of the signal comprises propagating an attribute of the signal of one or more of the following types: a data type, a dimension, a sample time, a frame type, or a complex number type.

62. The medium of claim 57, further comprising:
instructions for displaying a graphical representation of one or more portions of processing that can be performed concurrently on one or more sections of the graphical model.

63. The medium of claim 57, further comprising one or more instructions for:
combining a result of the first portion of the processing and a result of the second portion of the processing to generate code for the graphical model.

64. The medium of claim 57, wherein the graphical model is a block diagram model.

65. The medium of claim 57, wherein a portion of the graphical model includes one of a non-graphical language and a textual language.

66. The medium of claim 57, wherein the at least one node is processed only once.

67. The medium of claim 57, further comprising one or more instructions for:
compiling at least a portion of the graphical model or interpreting at least a portion of the graphical model.

68. A computer readable medium storing computer executable instructions which when executed by a computer perform distributing tasks for partitioning a processing of a graphical model, the processing including a first portion and a second portion, the medium comprising one or more instructions for:
identifying a first task, associated with the first portion of the processing, to distribute for processing;
identifying a second task, associated with the second portion of the processing, to distribute for processing, the first task or the second task including propagating an attribute of a signal identified in the graphical model;
processing concurrently the identified first task and the identified second task, the concurrent processing including generating one or more executable forms of the graphical model; and
storing the one or more executable forms in a storage device or a memory.

69. The medium of claim 68, further comprising one or more instructions for:
identifying one or more computing devices suitable to process at least one of the first task or the second task.

70. The medium of claim 68, further comprising one or more instructions for:
distributing for processing one of the first task or the second task to at least one of a first computing device or a second computing device.

71. The medium of claim 70, wherein the first computing device executes an operating system that is different than an operating system executed by the second computing device.

72. The medium of claim 68, further comprising one or more instructions for:
processing at least a portion of the first task concurrently with a processing of a portion of the second task.

73. The medium of claim 68, further comprising one or more instructions for:
combining a result of processing the first task with a result of processing the second task, the combined results providing at least a portion of the one or more executable forms of the graphical model.

74. The medium of claim 68, wherein the attribute represents one or more of the following: a data type, a dimension, a sample time, a frame type, and a complex number.

75. The medium of claim 68, wherein at least one of the executable forms includes: executable instructions, code, or a shared library.

76. The medium of claim 68, further comprising one or more instructions for:
compiling at least a portion of the graphical model or interpreting at least a portion of the graphical model.

77. A computer readable medium storing computer executable instructions which when executed by a computer perform distributing tasks for partitioning a processing of a first executable entity, the processing including a first portion and a second portion, the medium comprising one or more instructions for:
identifying a first task, associated with the first portion of the processing, to distribute for processing;
identifying a second task, associated with the second portion of the processing, to distribute for processing, the first task or the second task including propagating an attribute of a signal identified in the first executable entity, first portion or the second portion of the processing including a reference to a second executable entity;
processing concurrently the identified first task and the identified second task, the concurrent processing including generating one or more executable forms of the first executable entity and the second executable entity; and
storing the one or more executable forms in a storage device or a memory.

78. The medium of claim 77, wherein at least a portion of the processing of the second executable entity is performed by one of the first task or the second task.

79. The medium of claim 77, wherein one of the first executable entity or the second executable entity comprises a block diagram model.

80. The medium of claim 77, wherein a portion of one of the first executable entity and the second executable entity comprises one of a non-graphical language and a textual language.

81. The medium of claim 77, wherein at least one of the executable forms includes: executable instructions, code, or a shared library.

82. The medium of claim 77, further comprising one or more instructions for:
compiling the first executable entity or interpreting the first executable entity.

83. A system comprising:
means for generating a graph comprising a plurality of nodes, at least one node of the graph being depended upon by two or more nodes of the graph, the graph identifying one or more sections of a graphical model for which to perform one or more portions of a processing of the graphical model, the graph representing one or more separate paths of model compilation and one or more concurrent paths of model compilation;
means for identifying a first section of the graphical model, from the graph, for which to perform a first portion of the processing;
means for identifying a second section of the graphical model, from the graph, that can be concurrently processed with the identified first section and for which to perform a second portion of the processing;
means for processing concurrently the first section of the graphical model with the second section of the graphical model, the concurrent processing including:
generating, as part of the first portion of processing, code for the identified first section, and
generating, as part of the second portion of processing, code for the identified second section; and
means for storing the generated code for the identified first section and the generated code for the identified second section in at least one of a storage device and a memory.

84. The system of claim 83, wherein the at least one node is processed only once.

85. The system of claim 83, wherein the processor is further configured to:
compile at least a portion of the graphical model or interpret at least a portion of the graphical model.

86. A system comprising:
means for identifying a first task to distribute for a processing of a graphical model, the first task associated with a first portion of the processing;
means for identifying a second task to distribute for the processing of the graphical model, the second task associated with a second portion of the processing, the first task or the second task including propagating an attribute of a signal identified in the graphical model;
means for processing concurrently the identified first task and the identified second task, the concurrent processing including generating one or more executable forms of the graphical model; and
means for storing the one or more executable forms in a storage device or a memory.

87. The system of claim 86, wherein the attribute represents one or more of the following: a data type, a dimension, a sample time, a frame type, and a complex number.

88. The system of claim 86, wherein at least one of the executable forms includes: executable instructions, code, or a shared library.

89. The system of claim 86, wherein the processor is further configured to:
compile at least a portion of the graphical model or interpret at least a portion of the graphical model.

* * * * *

UNITED STATES PATENT AND TRADEMARK OFFICE
CERTIFICATE OF CORRECTION

PATENT NO. : 7,509,244 B1  Page 1 of 1
APPLICATION NO. : 11/021907
DATED : March 24, 2009
INVENTOR(S) : Mojdeh Shakeri et al.

It is certified that error appears in the above-identified patent and that said Letters Patent is hereby corrected as shown below:

Column 30, Line 43, in the printed patent "shows" should be --show--.

Column 30, Line 48, in the printed patent "a" should be --an--.

Signed and Sealed this

Second Day of June, 2009

JOHN DOLL
*Acting Director of the United States Patent and Trademark Office*